United States Patent [19]
Kimura

[11] Patent Number: 5,815,039
[45] Date of Patent: Sep. 29, 1998

[54] LOW-VOLTAGE BIPOLAR OTA HAVING A LINEARITY IN TRANSCONDUCTANCE OVER A WIDE INPUT VOLTAGE RANGE

[75] Inventor: Katsuji Kimura, Tokyo, Japan

[73] Assignee: NEC Corporation, Tokyo, Japan

[21] Appl. No.: 684,618

[22] Filed: Jul. 22, 1996

[30] Foreign Application Priority Data

Jul. 21, 1995 [JP] Japan ................................. 7-186089
Mar. 21, 1996 [JP] Japan ................................. 8-064344

[51] Int. Cl.$^6$ ........................................ H03F 3/45
[52] U.S. Cl. ..................... 330/252; 330/254; 330/261
[58] Field of Search ................... 330/252, 254, 330/261, 295

[56] References Cited

U.S. PATENT DOCUMENTS

| | | |
|---|---|---|
| 4,723,110 | 2/1988 | Voorman .................................. 330/252 |
| 4,951,003 | 8/1990 | De Jager et al. ....................... 330/252 |
| 5,481,224 | 1/1996 | Kimura . |
| 5,485,119 | 1/1996 | Kimura . |
| 5,500,623 | 3/1996 | Kimura . |
| 5,512,855 | 4/1996 | Kimura . |
| 5,521,542 | 5/1996 | Kimura . |
| 5,561,392 | 10/1996 | Kimura . |
| 5,578,965 | 11/1996 | Kimura . |
| 5,581,211 | 12/1996 | Kimura . |

*Primary Examiner*—James B. Mullins
*Attorney, Agent, or Firm*—Sughrue, Mion, Zinn, Macpeak & Seas, PLLC

[57] ABSTRACT

In a bipolar OTA (operational transconductance amplifier) including a plurality of triple-tail cells, each of the plurality of triple-tail cells comprises a transistor pair of first and second transistors (Q1 and Q2) forming a differential input/output pair and a third transistor (Q3) applied with a control voltage ($V_C$). The transistor pair and the third transistor are driven by a common tail current. The OTA has transistors (Q7 and Q8) for applying a dc offset voltage to an input signal of the differential input/output pair. The plurality of triple-tail cells have outputs connected in parallel.

5 Claims, 28 Drawing Sheets

//5,815,039//

LOW-VOLTAGE BIPOLAR OTA HAVING A LINEARITY IN TRANSCONDUCTANCE OVER A WIDE INPUT VOLTAGE RANGE

BACKGROUND OF THE INVENTION

This invention relates to a differential amplifier circuit and, in particular, to a differential amplifier circuit called a low-voltage OTA (Operational Transconductance Amplifier), which is formed on a bipolar semiconductor integrated circuit and which has an improved linearity in transconductance over a wide input voltage range.

A conventional bipolar OTA of the type described is proposed in 1975 by Schmoock ("An Input Stage Transconductance Reduction Technique for High-Slew Rate Operational Amplifiers," IEEE Journal of Solid-State Circuits, Vol. SC-10, No. 6, pp. 407–411, Dec. 1975) who discloses the approach of cross-coupling two differential pairs having different emitter areas. Since then, this approach has been used as a multi-tanh technique. The multi-tanh technique is known as a method of linearizing the transconductance by the use of differential pairs, N (N being a positive integer) in number (for example, Tanimoto et al, "Realization of a 1-V Active Filter Using a Linearization Technique Employing Plurality of Emitter-Coupled Pairs," IEEE Journal of Solid-State Circuits, Vol 26, No. 7, pp. 937–945, July 1991). The multi-tanh technique of Tanimoto et al will later be described as a conventional OTA.

In analog signal processing operations, an OTA is an essential functional block. As the process becomes finer, the supply voltage for an LSI is reduced from 5 V to 3 V, to 2 V, or to 1 V. A demand for a technique of a low-voltage circuit is more and more increasing. Although the conventional OTA is operable at a low voltage, a voltage range is very narrow as a linear input voltage range in the manner which will later be described. In order to widen the linear input voltage range, the circuit scale and the current consumption inevitably increase in a simple manner. On the other hand, the input offset voltage is given by the use of the transistors having different emitter areas. Inasmuch as the emitter area ratio which can be achieved is several tens at most, the input voltage range can not be widened more than 100 $mV_{0-P}$.

SUMMARY OF THE INVENTION

It is therefore an object of this invention to provide a bipolar OTA which is operable at a low voltage and which is capable of realizing a linearity over a wide input voltage range with a simple circuit structure.

According to a first aspect of this invention, there is provided a bipolar OTA (operational transconductance amplifier) including a plurality of triple-tail cells each of which comprises a transistor pair of first and second transistors forming a differential input/output pair and a third transistor applied with a control voltage, the transistor pair and the third transistor being driven by a common tail current, the OTA comprising means for applying a dc offset voltage to an input signal of the differential input/output pair, the plurality of triple-tail cells having outputs connected in parallel.

According to a second aspect of this invention, there is provided a bipolar OTA as described in the first aspect of this invention, wherein a current which flows through the third transistor of each of the plurality of triple-tail cells is distributed into two distributed currents which are equal to each other and which are added to a differential output current of each of the plurality of triple-tail cells.

According to a third aspect of this invention, there is provided a bipolar OTA (operational transconductance amplifier) including a quadri-tail cell which comprises a transistor pair of first and second transistors forming a differential input/output pair and third and fourth transistors applied with a control voltage in common, the transistor pair and the third and the fourth transistors being driven by a common tail current, the first and the third transistors having outputs which are connected to each other to form a first common output, the second and the fourth transistors having outputs which are connected to each other to form second common output which forms an output pair together with the first common output, wherein the first and the second transistors have emitters of a first common emitter area, the third and the fourth transistors have emitters of a second common emitter area which is equal to K (K being a positive number) times the first common emitter area, the control voltage $V_C$ being defined so as to become substantially equal to $V_T \log_e (K/2)$, where $V_T$ represents the thermal voltage (26 mV at room temperature).

According to a fourth aspect of this invention, there is provided a bipolar OTA (operational transconductance amplifier) including a plurality of triple-tail cells each of which comprises a transistor pair of first and second transistors forming a differential input/output pair and a third transistor applied with a control voltage, the transistor pair and the third transistor being driven by a common tail current, the plurality of triple-tail cells having outputs connected in parallel and inputs connected in parallel, the control voltages of the third transistors of the plurality of triple-tail cells being different from each other.

According to a fifth aspect of this invention, there is provided a bipolar OTA as described in the fourth aspect of this invention, wherein a current which flows through the third transistor of each of the plurality of triple-tail cells is distributed into two distributed currents which are equal to each other and which are added to a differential output current of each of the plurality of triple-tail cells.

DESCRIPTION OF THE PREFERRED EMBODIMENTS

Figure 1:
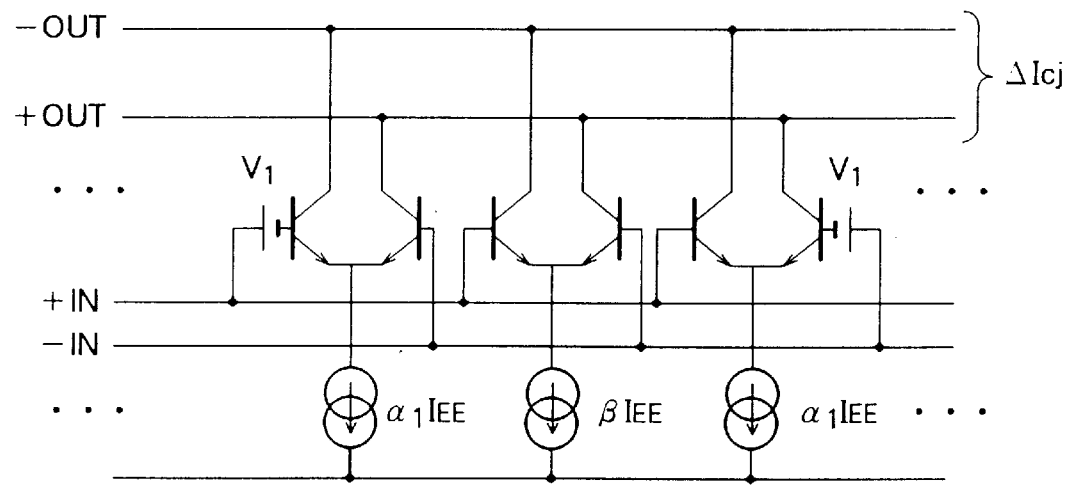
FIG. 1 is a circuit diagram of a conventional bipolar OTA.

Referring to FIG. 1, a conventional bipolar OTA will be described for a better understanding of this invention. The conventional bipolar OTA uses the multi-tanh technique of Tanimoto et al referred in the preamble of the instant specification. As mentioned above, the multi-tanh technique is known as a method of linearizing the transconductance by the use of differential pairs, N in number.

In a transistor, the relationship between a collector current $I_C$ and a base-to-emitter voltage $V_{BE}$ is given by the following equation, neglecting base-width modulation.

$$I_C = KI_S \exp\left(\frac{V_{BE}}{V_T}\right) \quad (1)$$

Herein, $I_S$ represents a saturation current of a unit transistor and $V_T$ represents the thermal voltage defined by $V_T = kT/q$, where q represents a unit electron charge, k representing Boltzmann's constant, T representing absolute temperature. Furthermore, K represents an emitter area ratio to the unit transistor.

With the bipolar OTA illustrated in FIG. 1, a low-voltage operation is enabled. A very-low-voltage operation at a supply voltage of 1 V is reported in the Tanimoto et al reference.

A differential output current $\Delta I_{Cj}$ of the differential pair having the emitter area ratio of $K_j$: 1 is given by:

$$\Delta I_{Cj} = I_{C1j} - I_{C2j} = \alpha_F I_{0j} \tanh\left(\frac{V_i - V_{Kj}}{2V_T}\right) \quad (2)$$

$$= \alpha_F I_{0j} \frac{\sinh\left(\frac{V_i + V_{Kj}}{2V_T}\right)}{\cosh\left(\frac{V_i + V_{Kj}}{2V_T}\right)} \quad (3)$$

Herein, $\alpha_F$ represents a dc common-base current gain factor and $V_{Kj}$ represents an offset voltage defined by $V_{Kj} = V_T \log_e(K_j)$.

Generally, the differential output current of the differential pair is represented by tanh (hyperbolic tangent function) as shown in Equation (2) or represented in the function form with sinh (hyperbolic sine function) and cosh (hyperbolic cosine function) as a numerator and a denominator, respectively, as shown in Equation (3). The linearity of the differential output current with respect to an input signal is determined by the function farm of cosh in the denominator when the numerator consists of sinh alone.

The differential output current Δ I of a multi-tanh cell composed of the differential pairs, 2N or (2N+1) In number, is given by:

$$\Delta I = \alpha_F \sum_{j=0 \text{ or } 1}^{2N} \left\{ I_{0j} \tanh\left(\frac{V_i + V_{Kj}}{2V_T}\right) \right\} \quad (4)$$

$$= \alpha_F \sum_{j=0 \text{ or } 1}^{2N} \left\{ \frac{I_{0j} \sinh\left(\frac{V_i + V_{Kj}}{2V_T}\right)}{\cosh\left(\frac{V_i + V_{Kj}}{2V_T}\right)} \right\} \quad (5)$$

In case of 2N, calculation is carried out from j=1 to j=2N. In case of (2N+1), calculation is carried out from j=0 to j=2N. $V_{KO} = V_T \log_e 1 = 0$ holds. From Equation (4), this approach is called the multi-tanh technique.

In a linear transconductance amplifier, the offset voltage $V_{Kj}$ is given by $V_{Kj} = -V_{Kj-1}$. For the two symmetrical differential pairs illustrated in FIG. 1, the following equation holds:

$$\Delta I_{C2j} = \Delta I_{Cj-1} + \Delta C_j = \frac{2\alpha_F I_{0j} \sinh\left(\frac{V_i}{V_T}\right)}{\cosh\left(\frac{V_i}{V_T}\right) + \cosh\left(\frac{V_{Kj}}{V_T}\right)} \quad (6)$$

Accordingly, the differential output current Δ I of the multi-tanh cell composed of the differential pairs, 2N or (2N+1) in number, is given by:

$$\Delta I = \Delta I_{C0} + \sum_{j=1}^{N} \Delta I_{C2j} \quad (7)$$

(in case of 2N, $\Delta I_{C0} = 0$)

$$= \frac{\alpha_F \left[\sum_{j=1}^{N} \left\{ C_j \sinh\left(\frac{jV_i}{V_T}\right) \right\}\right]}{\sum_{j=0}^{N} \left\{ B_j \cosh\left(\frac{jV_i}{V_T}\right) \right\}} \quad \text{(in case of 2N)} \quad (8a)$$

$$\alpha_F \left[ \sum_{j=1}^{N+1} \left\{ C_j \sinh\left(\frac{jV_i}{V_T}\right) \right\} \right] \Bigg/ \sum_{j=0}^{N+1} \left\{ B_j \cosh\left(\frac{jV_i}{V_T}\right) \right\} \quad \text{(in case of } (2N+1)\text{)} \tag{8b}$$

Considering the symmetry, the transconductance of the multi-tanh cell is maximully flat under the condition that odd-order derivatives are equal to zero at $V_i=0$.

$$\frac{d^3(\Delta I)}{dV_i^3}\bigg|_{V_i=0} = \frac{d^5(\Delta I)}{dV_i^5}\bigg|_{V_i=0} = \ldots = \frac{d^{2n+1}(\Delta I)}{dV_i^{2n+1}}\bigg|_{V_i=0} = 0$$

Since the transconductance is maximum at $V_i=0$, the following condition holds:

$$\frac{d(\Delta I)}{dVi} \leq \frac{d(\Delta I)}{dVi}\bigg|_{V_i=0} \tag{10}$$

For example, the circuit illustrated in FIG. 1 is called a multi-tanh doublet in case of 2N=2. The condition for the maxiomully flat transconductance is determined from:

$$d^3(\Delta I)/dV_i^3|_{V_i=0}=0$$

The emitter area ratio K is calculated as $K=2\pm3^{1/2}$. $B_1=1$, $B_0=\cosh\{\log_e(k)\}=2$, and $C_1=2$ are given. The differential output current is represented by:

$$\Delta I = \frac{2\alpha_F I_0 \sinh\left(\frac{V_i}{V_T}\right)}{\cosh\left(\frac{V_i}{V_T}\right) + 2} \tag{11}$$

In case of 2N+1=3, the circuit is called a multi-tanh triplet. In this case, $B_2=1$, $B_1=9$, $B_0=0$, $C_2=2.64$, $C_1=6.48$ are given. The differential output current is represented by:

$$\Delta I = \frac{\alpha_F I_0 \left\{ 2.64\sinh\left(\frac{3V_i}{2V_T}\right) + 6.48\sinh\left(\frac{V_i}{2V_T}\right) \right\}}{\cosh\left(\frac{3V_i}{2V_T}\right) + 9\cosh\left(\frac{V_i}{2V_T}\right)} \tag{12}$$

In case of 2N=4, the circuit is called a multi-tanh quin. $B_2=1$, $B_1=16$, $B_0=18$, $C_2=3.0957$, and $C_1=19.81269$ are given. The differential output current is represented by:

$$\Delta I = \frac{\alpha_F I_0 \left\{ 3.0957\sinh\left(\frac{2V_i}{V_T}\right) + 19.81269\sinh\left(\frac{V_i}{V_T}\right) \right\}}{\cosh\left(\frac{2V_i}{V_T}\right) + 16\cosh\left(\frac{V_i}{V_T}\right) + 2} \tag{13}$$

Equation (13) is based on the Tanimoto et al reference. In such manner of expression without using the hyperbolic tangent function (tanh(x)), the origin of the appellation of the multi-tanh technique is concealed. It will be noted that, in the transfer characteristic of the OTA circuit realizing the maximully flat characteristic, the coefficient In the denominator has an integral value as seen from Equations (11) through (13). The multi-tanh technique can realize a linear input voltage range on the order of no more than 200 mV$_{P-P}$ at maximum.

It has been revealed that the differential output current $\Delta$ I of the multi-tanh cell composed of the differential pairs, 2N or (2N+1) in number, is represented by the function of cosh as the denominator and the function of sinh as the numerator.

Thus, the conventional OTA is defective in those described in the preamble of the instant specification.

Now, description will be made as regards embodiments of this invention with reference to the drawing.

A circuit comprising three or more transistors driven by a single common tail current is called a multitail cell by the present inventor. Specifically, the circuit comprising three transistors is called a triple-tail cell. The circuit comprising four transistors is called a quadri-tail cell.

Figure 2:
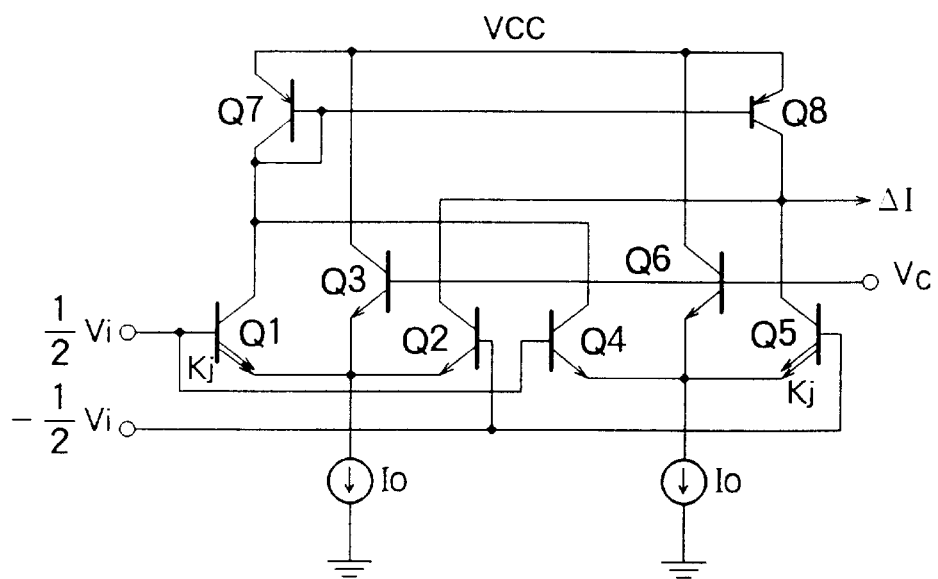
FIG. 2 is a circuit diagram of a bipolar OTA according to a first embodiment of this invention.

Referring to FIG. 2, description will be made as to a bipolar OTA according to a first embodiment of this invention which is a first example of the above-mentioned bipolar OTA according to the first aspect of this invention.

The triple-tail cell comprising transistors Q1, Q2, and Q3 (each being a bipolar transistor) with an emitter area ratio of $K_j$:1:1 is referred to as an unbalanced triple-tail cell. FIG. 2 shows the bipolar OTA comprising two unbalanced triple-tail cells. The transistors Q4, Q5, and Q6 have an emitter area ratio of 1:$K_j$:1.

The transistors Q1, Q2, and Q3 of the unbalanced triple-tail cell are driven by a tail current $I_0$. Assuming matched devices, collector currents $I_{C1}$, $I_{C2}$, and $I_{C3}$ of these transistors are represented by:

$$I_{C1} = K_j I_s \exp\left(\frac{V_i/2 + V_R - V_E}{V_T}\right) \tag{14}$$

$$I_{C2} = I_s \exp\left(\frac{-V_i/2 + V_R - V_E}{V_T}\right) \tag{15}$$

$$I_{C3} = I_s \exp\left(\frac{V_C + V_R - V_E}{V_T}\right) \tag{16}$$

Herein, $V_R$ represents a dc voltage of an input signal and $V_E$ represents a common emitter voltage.

From the condition for the tail current, the following equation holds:

$$I_{C1} + I_{C2} + I_{C3} = \alpha_F I_0 \tag{17}$$

Solving Equations (14) through (17), the following equation is given by:

$$I_s \exp\left(\frac{V_R - V_E}{V_T}\right) = \frac{\alpha_F I_0}{K_j \exp\left(\frac{V_i}{2V_T}\right) + \exp\left(-\frac{V_i}{2V_T}\right) + \exp\left(\frac{V_C}{V_T}\right)} \tag{18}$$

A differential output current $\Delta I_{CK2j}$ of one of the unbalanced triple-tail cells illustrated in FIG. 2 is given by:

$$\Delta I_{CK2j} = I_{C1} - I_{C2} \tag{19}$$

$$= \frac{\alpha_F I_0 \left\{ K_j \exp\left(\frac{V_i}{2V_T}\right) - \exp\left(\frac{V_i}{2V_T}\right) \right\}}{K_j \exp\left(\frac{V_i}{2V_T}\right) + \exp\left(-\frac{V_i}{2V_T}\right) + \exp\left(\frac{V_C}{V_T}\right)}$$

$$= \frac{\alpha_F I_0 \sqrt{K_j} \left\{ \sqrt{K_j} \exp\left(\frac{V_i}{2V_T}\right) - \frac{1}{\sqrt{K_j}} \exp\left(\frac{V_i}{2V_T}\right) \right\}}{\sqrt{K_j} \left\{ \sqrt{K_j} \exp\left(\frac{V_i}{2V_T}\right) + \frac{1}{\sqrt{K_j}} \exp-\left(\frac{V_i}{2V_T}\right) + \frac{1}{\sqrt{K_j}} \exp\left(\frac{V_C}{V_T}\right) \right\}}$$

$$= \frac{2\alpha_F I_{0j} \sinh\left(\frac{V_i + V_{Kj}}{2V_T}\right)}{2\cosh\left(\frac{V_i + V_{Kj}}{2V_T}\right) + \exp\left(\frac{2V_{Cj} - V_{Kj}}{2V_T}\right)}$$

$$= \frac{\alpha_F I_{0j} \sinh\left(\frac{V_i + V_{Kj}}{2V_T}\right)}{\cosh\left(\frac{V_i + V_{Kj}}{2V_T}\right) + \frac{1}{2}\exp\left(\frac{2V_{Cj} - V_{Kj}}{2V_T}\right)} \quad (20)$$

Thus, the offset voltage $V_{Kj}$ is given to the input. Herein, $V_{Kj}=V_T \log_e K_j$ holds. As readily supposed from the multi-tanh technique, a linear transconductance amplifier is realized by cross-coupling the two triple-tail cells having the input offset voltages as illustrated in FIG. 2.

Accordingly, a differential output current $\Delta I$ of a multiple triple-tail cell circuit comprising unbalanced and balanced triple-tail cells, 2N or (2N+1) in number, is given by:

$$\Delta I = \Delta I_{C0} + \sum_{j=1}^{N} \Delta I_{CK2j} \quad (21)$$

(in case of 2N, $\Delta I_{CO} = 0$)

$$= \frac{\alpha_F \left[ \sum_{j=1}^{N} \left\{ C_j \sinh\left(\frac{jV_i}{2V_T}\right) \right\} \right]}{\sum_{j=0}^{N} \left\{ B_j \cosh\left(\frac{jV_i}{2V_T}\right) \right\}} \text{(in case of 2N)} \quad (22a)$$

$$= \frac{\alpha_F \left[ \sum_{j=1}^{N+1} \left\{ C_j \sinh\left(\frac{jV_i}{2V_T}\right) \right\} \right]}{\sum_{j=0}^{N+1} \left\{ B_j \cosh\left(\frac{jV_i}{2V_T}\right) \right\}} \text{(in case of (2N + 1))} \quad (22b)$$

The transconductance is maximully flat under the condition similar to that represented by Equations (9) and (10) (although analytical solution is impossible because a high-order function is given).

As a specific example, the differential output current $\Delta I$ of the double unbalanced triple-tail cell circuit comprising the two unbalanced triple-tail cells illustrated in FIG. 2 is given by:

$$\Delta I = \frac{\alpha_F I_{01} \sinh\left(\frac{V_i - V_{K1}}{2V_T}\right)}{\cosh\left(\frac{V_i + V_{K1}}{2V_T}\right) + \frac{1}{2}\exp\left(\frac{2V_{C1} - V_{K1}}{2V_T}\right)} + \frac{\alpha_F I_{01} \sinh\left(\frac{V_i - V_{K1}}{2V_T}\right)}{\cosh\left(\frac{V_i - V_{K1}}{2V_T}\right) + \frac{1}{2}\exp\left(\frac{2V_{C1} - V_{K1}}{2V_T}\right)}$$

$$= \frac{2\alpha_F I_{01} \sinh\left\{ \left(\frac{V_i}{V_T}\right) + \exp\left(\frac{2V_{C1} - V_{K1}}{2V_T}\right) \cosh\left(\frac{V_{K1}}{2V_T}\right) \sinh\left(\frac{V_i}{2V_T}\right) \right\}}{\cosh\left(\frac{V_i}{V_T}\right) + 2\exp\left(\frac{2V_{C1} - V_{K1}}{2V_T}\right) \cosh\left(\frac{V_{K1}}{2V_T}\right) \cosh\left(\frac{V_1}{2V_T}\right) + \frac{1}{2}\exp\left(\frac{2V_{C1} - V_{K1}}{V_T}\right)}$$

$$= \frac{\alpha_F I_{01} \left\{ 2\sinh\left(\frac{V_i}{V_T}\right) + a\sinh\left(\frac{V_i}{2V_T}\right) \right\}}{\cosh\left(\frac{V_i}{V_T}\right) + a\cosh\left(\frac{V_i}{2V_T}\right) + b} \quad (23)$$

Herein, $V_{K1}=V_T \log_e K$ and:

$$a = 2\exp\left(\frac{2V_{C1} - V_{K1}}{2V_T}\right) \cosh\left(\frac{V_{K1}}{2V_T}\right) \cosh\left(\frac{V_i}{2V_T}\right) \quad (24)$$

$$b = \frac{1}{2}\exp\left(\frac{2V_{C1} - V_{K1}}{V_T}\right) \quad (25)$$

The transconductance is obtained by taking a derivative of Equation (23).

Figure 3:
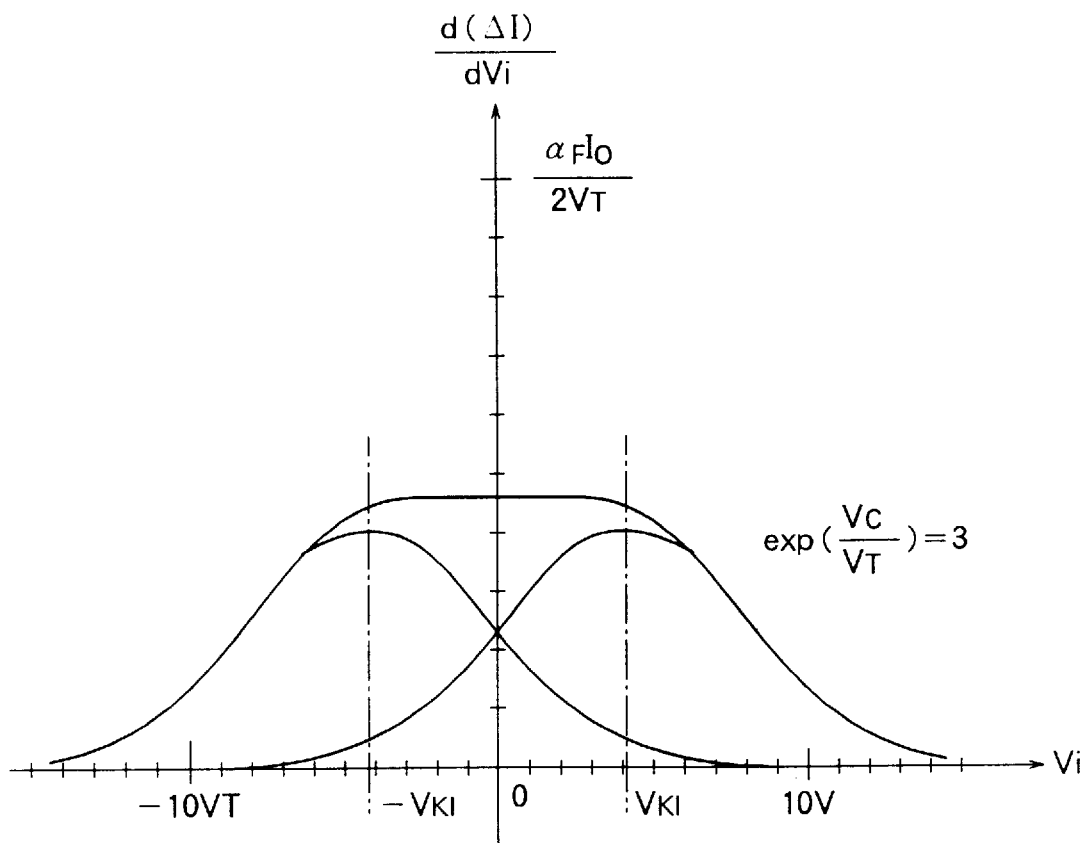
FIG. 3 is a view illustrating a transconductance characteristic ($V_C/V_T=\log_e 3$) of the bipolar OTA illustrated in FIG. 1.
Figure 4:
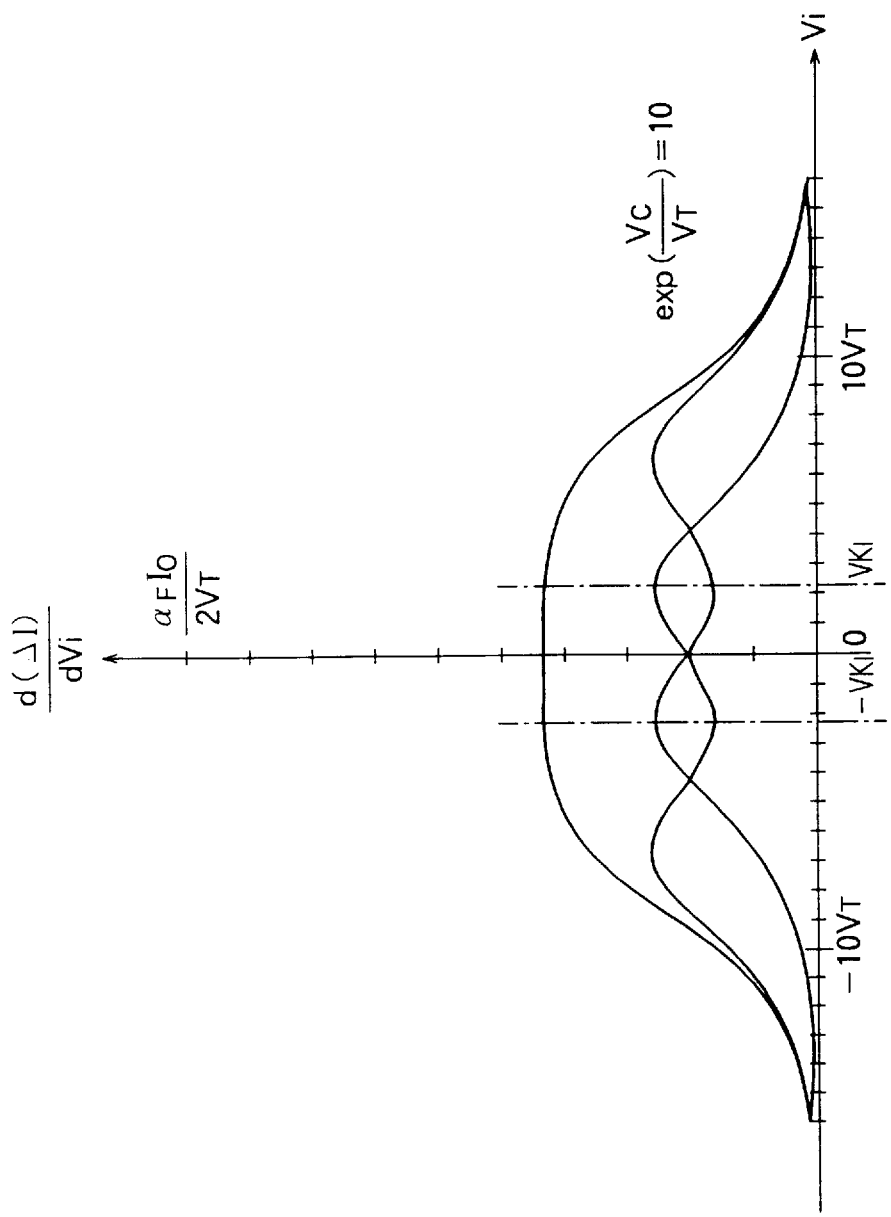
FIG. 4 is a view illustrating the transconductance characteristic ($V_C/V_T=\log_e 10$) of the bipolar OTA illustrated in FIG. 1.

FIGS. 3 and 4 show the transconductances of the double unbalanced triple-tail cell circuit thus realized. In FIG. 3, K=66.69 and $V_C=V_T \log_e 3$ (=1.0986 $V_T$). The linear input voltage range slightly greater than 200 m$V_{P-P}$ is obtained. In FIG. 4 on the other hand, K=9.025, $V_C=V_T \log_e 10$ (=2.3025 $V_T$). The linear input voltage range on the order of 250 m$V_{PP}$ is expected. Although the conditions represented by Equations (9) and (10) are not calculated, it is understood that the bipolar OTA having a transconductance characteristic substantially similar to the maximully flat characteristic with little ripple is achieved.

As another example, the differential output current $\Delta I$ of a triple-tail cell circuit comprising two unbalanced triple-tail cells and one balanced triple-tail cell is represented by:

$$\Delta I = \frac{\alpha_F I_{01} \sinh\left(\frac{V_i + V_{K1}}{2V_T}\right)}{\cosh\left(\frac{V_i + V_{K1}}{2V_T}\right) + \frac{1}{2}\exp\left(\frac{2V_{C1} - V_{K1}}{2V_T}\right)} + \frac{\alpha_F I_{01} \sinh\left(\frac{V_i - V_{K1}}{2V_T}\right)}{\cosh\left(\frac{V_i - V_{K1}}{2V_T}\right) + \frac{1}{2}\exp\left(\frac{2V_{C1} - V_{K1}}{2V_T}\right)} + \quad (26)$$

$$\frac{\alpha_F I_{00}\sinh\left(\frac{V_i}{2V_T}\right)}{\cosh\left(\frac{V_i}{2V_T}\right) + \frac{1}{2}\exp\left(\frac{V_{C0}}{V_T}\right)} - \frac{\alpha_F I_{00}\left[(1+d)\sinh\left(\frac{3V_i}{2V_T}\right) + \{a + (a+2c)d\}\sinh\left(\frac{V_i}{V_T}\right) + \{(2b-1) + (1+2ac)d\}\sinh\left(\frac{V_i}{2V_T}\right)\right]}{\cosh\left(\frac{3V_i}{2V_T}\right) + (a+2c)\cosh\left(\frac{V_i}{V_T}\right) + (1+2b+2ac)\cosh\left(\frac{V_i}{2V_T}\right) + 2bc + a}$$

Herein, $$c = \frac{1}{2}\exp\left(\frac{V_{C0}}{V_T}\right) \quad (27)$$

$$d = \frac{I_{01}}{I_{00}} \quad (28)$$

As will be understood from FIG. 2, the bipolar OTA thus obtained is operable at a low voltage like the bipolar OTA using the conventional multi-tanh technique, even at a very low voltage such as the supply voltage VCC=1 V. As described in the foregoing, it is also possible according to the first embodiment of this invention to widen the linear input voltage range in a manner similar to the conventional multi-tanh technique. Herein, comparison between two examples plotted in FIGS. 3 and 4 will lead to the understanding which will presently be described. In case where the offset voltage given to the input signal is produced by the use of the transistors having different emitter areas, it Is not always true that, like in the conventional multi-tanh technique, the offset voltage is increased in approximate proportion to the expansion of the linear input voltage range and the emitter area ratio is exponentially increased. The wide linear input voltage range can be realized at an emitter area ratio smaller than that required in the conventional multi-tanh technique. When the linear input voltage range is further widened by the use of three or more triple-tail cells, it may be difficult to produce the offset voltage by varying the emitter area ratio. In this event, the offset voltage given to the input signal can be produced outside of the triple-tail cell.

Figure 5:
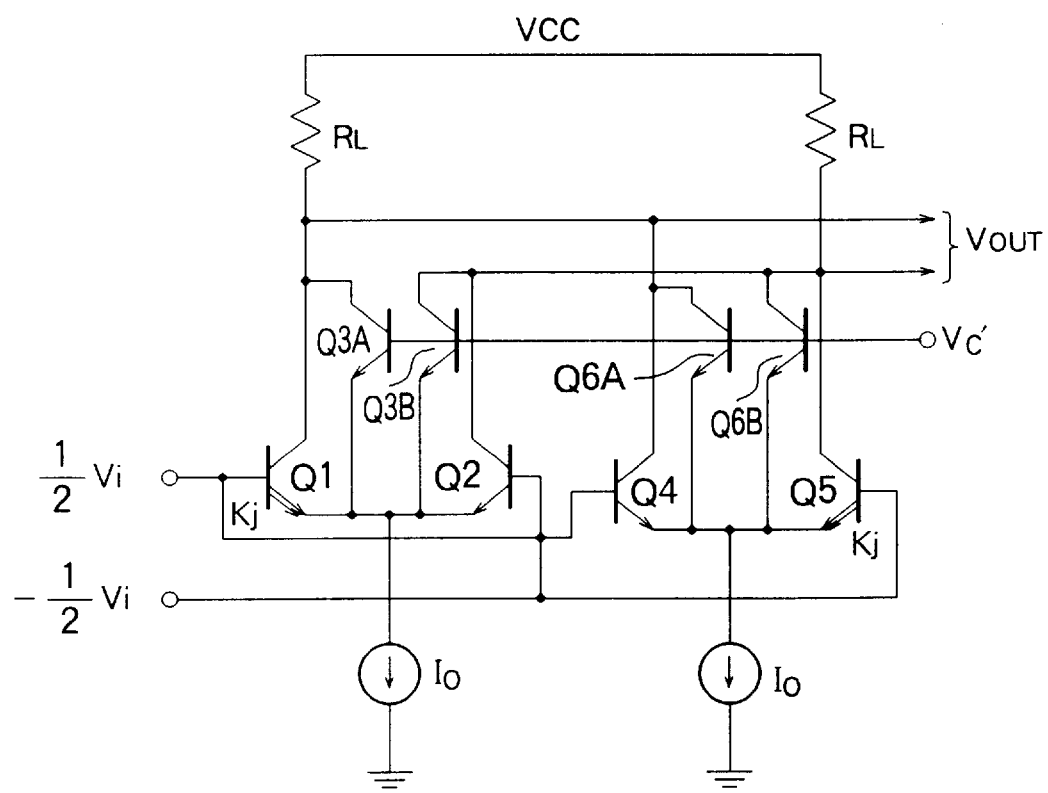
FIG. 5 is a circuit diagram of a bipolar OTA according to a second embodiment of this invention.

Turning to FIG. 5, description will proceed to a bipolar OTA according to a second embodiment of this invention. The bipolar OTA according to the second embodiment of this invention is an example of the above-mentioned bipolar OTA according to the second aspect of this invention.

With the bipolar OTA of FIG. 2, it is necessary to produce the differential output current by the use of active loads Q7 and Q8. As an alternative circuit arrangement which is more suitable for an LSI, use is made of resistance loads $R_L$ as in FIG. 5. The bipolar OTA using the resistance loads $R_L$ can be easily realized as the LSI from the viewpoint of process of manufacturing the bipolar OTA. Inasmuch as linear operation is necessary in the bipolar OTA, it is necessary to keep the output dc voltage constant irrespective of the input voltage.

Description will be made as regards the reason why the output dc voltage is kept constant irrespective of the input voltage in FIG. 5. Inasmuch as the driving currents of the triple-tail cells are constant tail currents equal to each other, it is readily understood that each of the differential currents becomes equal to $I_0$ on no-signal state (where the voltage of the input signal is zero) by distributing the bypass current flowing through each of the transistors Q3 and Q6 into two distributed currents equal to each other and by adding two distributed currents to the output current of each of the triple-tail cells. This is achieved by transistors Q3A and Q3B and by transistors Q6A and Q6B. Therefore, the output dc voltage has a constant value (VCC–$R_L I_0$). The control voltage $V_C'$ is also obtained as:

$$V_C' = V_C - V_T \log_e 2 \quad (28\text{-}b)$$

Therefore; the control voltage $V_C'$ is lowered by approximately 18 mV than the original control voltage $V_C$ at room temperature.

Figure 6:
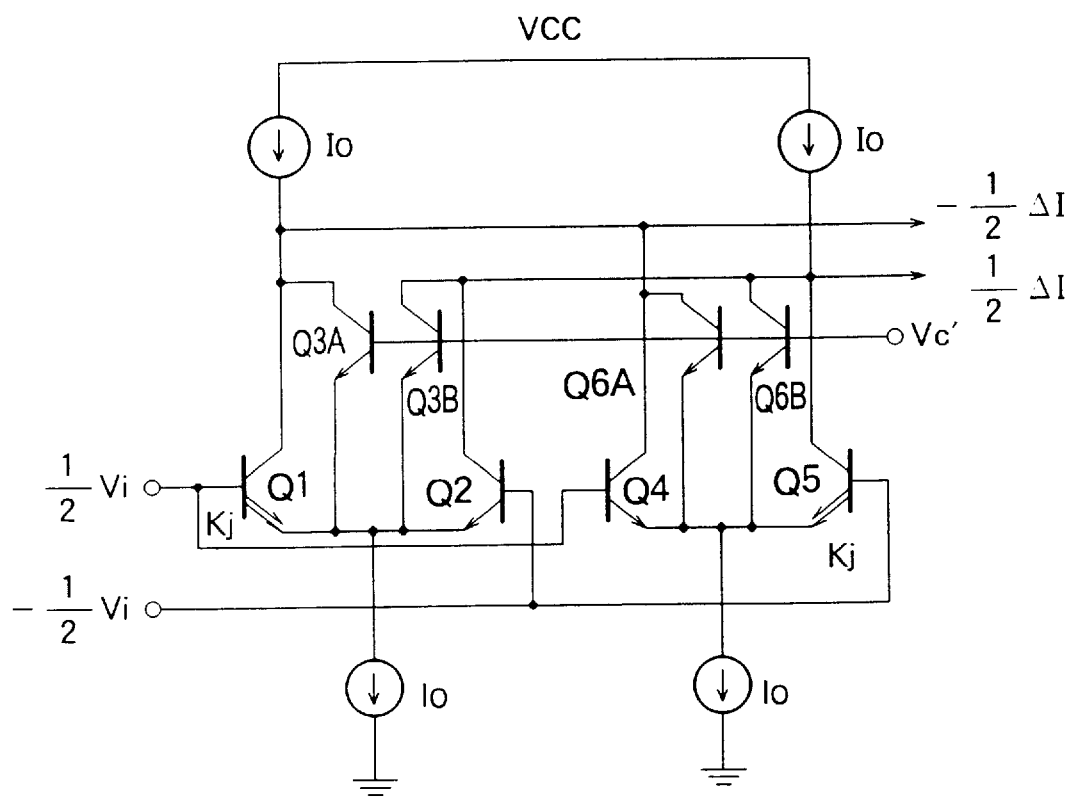
FIG. 6 is a circuit diagram of a bipolar OTA according to a third embodiment of this invention.

Turning to FIG. 6, description will proceed to a bipolar OTA according to a third embodiment of this invention. The bipolar OTA according to the third embodiment of this invention is another example of the above-mentioned bipolar OTA according to the second aspect of this invention.

The bipolar OTA of FIG. 6 is similar to that of FIG. 5 except that current loads $I_0$ are used instead of the resistance loads $R_L$ as differential output terminals. In this case, the obtained linear current can be produced through the current loads (load current supplies) $I_0$.

Figure 7:
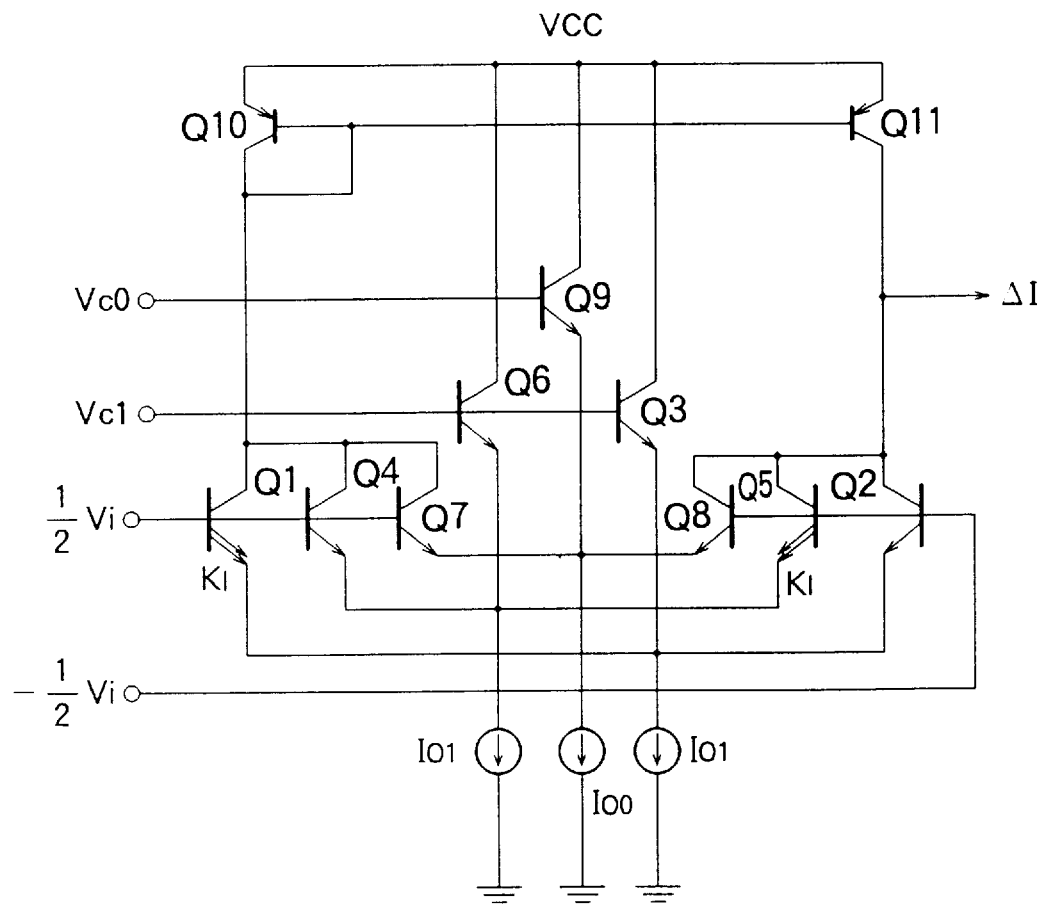
FIG. 7 is a circuit diagram of a bipolar OTA according to a fourth embodiment of this invention.

Turning to FIG. 7, description will proceed to a bipolar OTA according to a fourth embodiment of this invention. The bipolar OTA according to the fourth embodiment of this invention is another example of the above-mentioned bipolar OTA according to the first aspect of this invention.

In FIG. 7, the bipolar OTA is a super-multi-tanh triplet realized by two unbalanced triple-tail cells (Q1, Q4, and Q7) and (Q2, Q5, and Q8) and a balanced triple-tail cell (Q3, Q6, and Q9).

Figure 8:
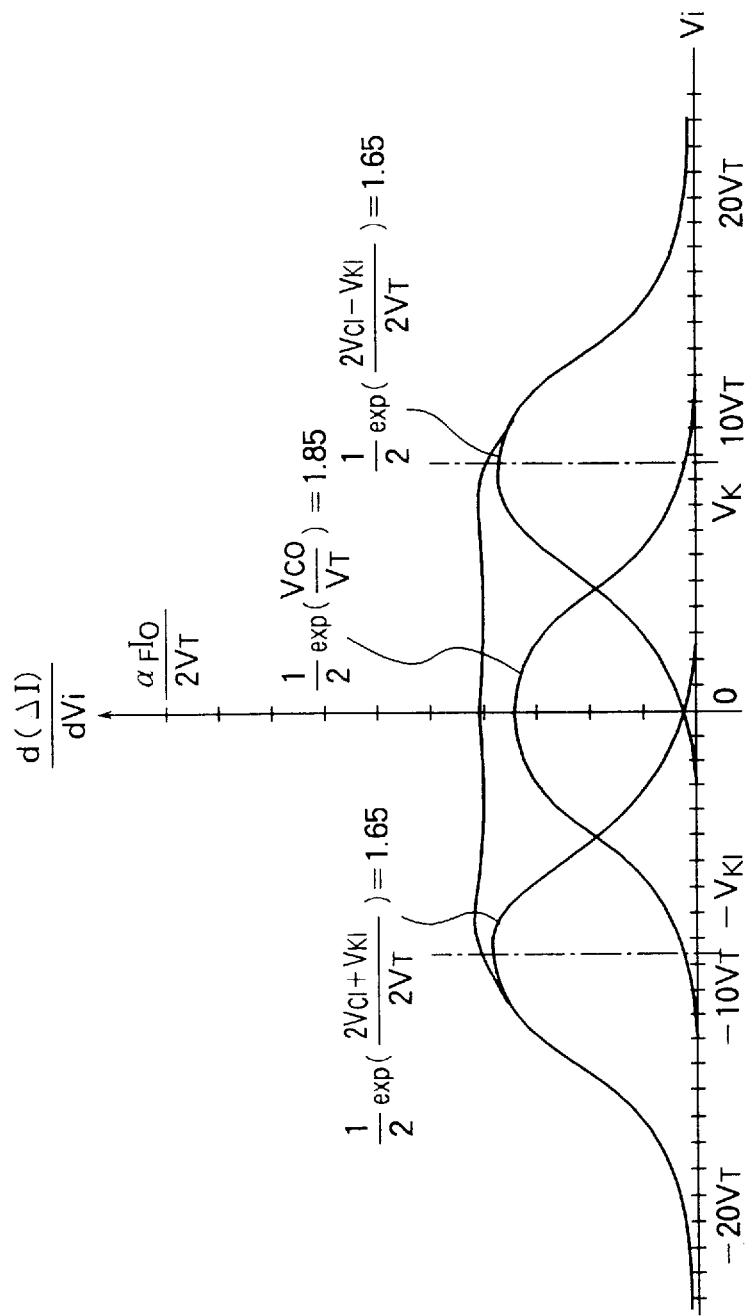
FIG. 8 is a view illustrating a transconductance characteristic of the bipolar OTA illustrated in FIG. 7.

Calculated values of the transconductance of the bipolar OTA of FIG. 7 are shown in FIG. 8 when the three tail currents of the three triple-tail cells are equal to one another (that is, $I_{00}=I_{01}=I_0$) so as to be suitable for the LSI. As shown in FIG. 8, $\exp\{(2V_{C1}-V_{K1})/(2V_T)\}=3.3$, $\exp\{(2V_{C0})/(V_T)\}=3.7$, and $V_{K1}=9.6 V_T$. An obtained practical input voltage range is approximately 450 $mV_{p-p}$. Thus, although the maximully flat characteristic can not be obtained, an approximate linear transconductance characteristic can be obtained over a wide input voltage range.

Figure 9:
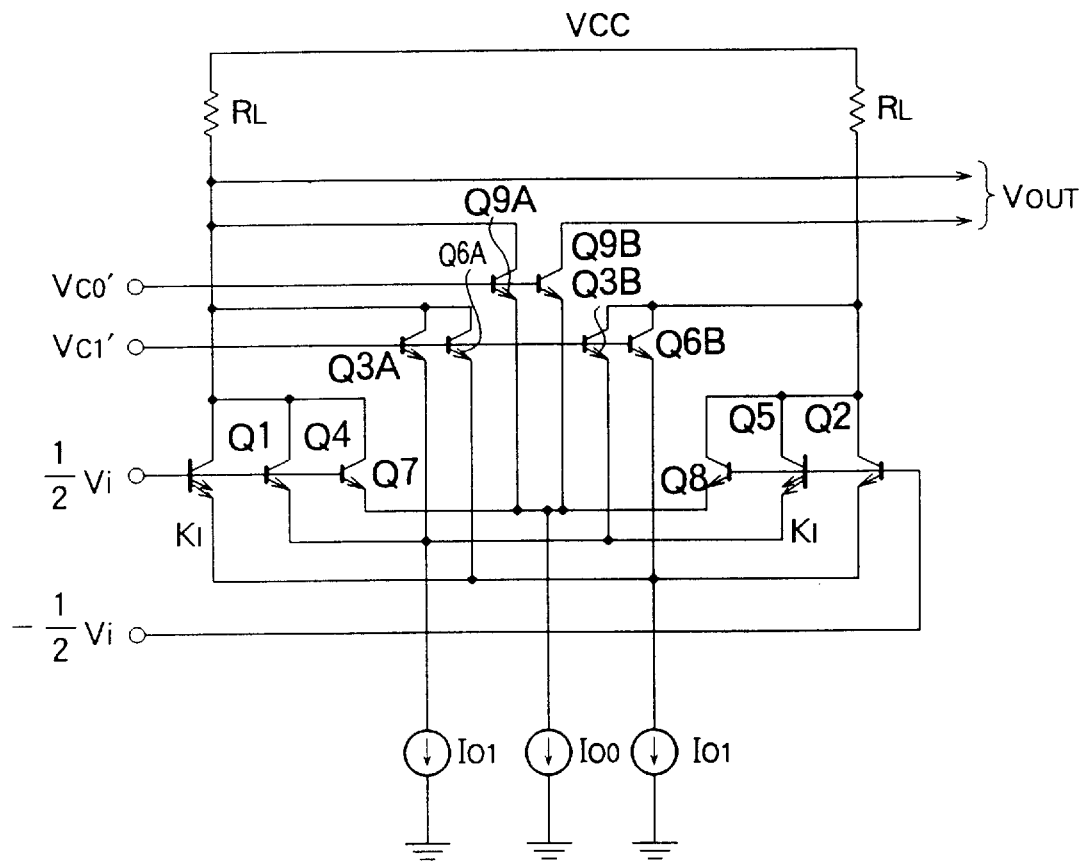
FIG. 9 is a circuit diagram of a bipolar OTA according to a fifth embodiment of this invention.

Turning to FIG. 9, description will proceed to a bipolar OTA according to a fifth embodiment of this invention. The bipolar OTA according to the fifth embodiment of this Invention is still another example of the above-mentioned bipolar OTA according to the second aspect of this invention.

Like in the bipolar OTA of FIG. 5, a circuit arrangement suitable for an LSI is obtained by the use of resistance loads $R_L$ in FIG. 9. In the bipolar OTA of FIG. 9, the bypass current flowing through each of the transistors Q3, Q6, and Q9 is distributed into two distributed currents which are equal to each other. Two distributed currents are added to the output current of each of the triple-tail cell. This is achieved by transistors Q3A and Q3B, transistors Q6A and Q6B, and transistors Q9A and Q9B. The control voltage $V_{C0}'$ is otained as:

$$V_{C0}' = V_{C0} - V_T \log_e 2 \quad (28\text{-c})$$

$$V_{C1}' = V_{C1} - V_T \log_e 2 \quad (28\text{-d})$$

Therefore, the control voltages $V_{C0}'$ and $V_{C1}'$ are lowered by approximately 18 mV than the original control voltage $V_C'$ at room temperature.

Figure 10:
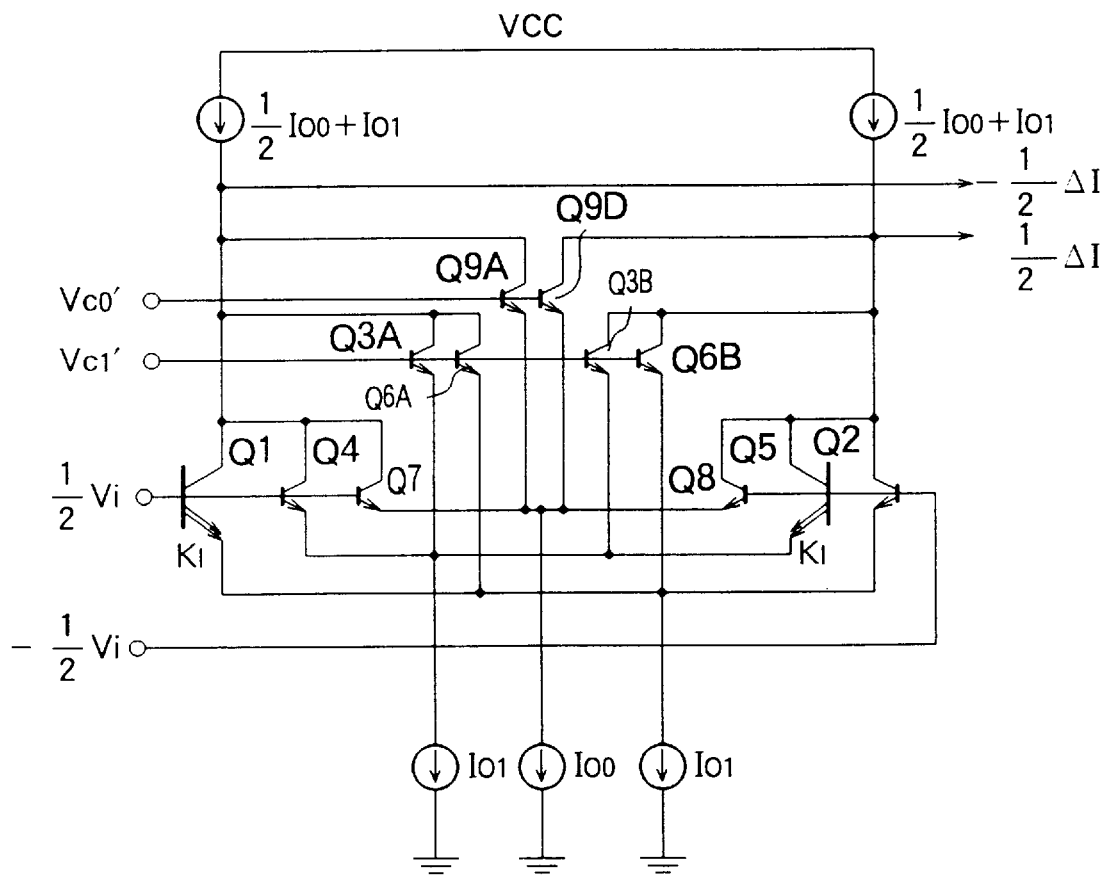
FIG. 10 is a circuit diagram of a bipolar OTA according to a sixth embodiment of this invention.

Turning to FIG. 10, description will proceed to a bipolar OTA according to a sixth embodiment of this invention. The bipolar OTA according to the sixth embodiment of this invention is a further example of the above-mentioned bipolar OTA according to the second aspect of this invention.

The bipolar OTA of FIG. 10 is similar to that of FIG. 9 except that current loads ($I_{00}/2 + I_{01}$) are used instead of the resistance loads $R_L$ as differential output terminals. In this case, the obtained linear current can be produced through the current loads (load current supplies) ($I_{00}/2 + I_{01}$).

The technique according to the above-mentioned first aspect of this invention is superior to the conventional multi-tanh technique and is therefore called the super-multi-tanh technique in order to distinguish from the conventional multi-tanh technique.

Description will proceed to bipolar OTA's according to the above-mentioned third aspect of this invention.

Figure 11:
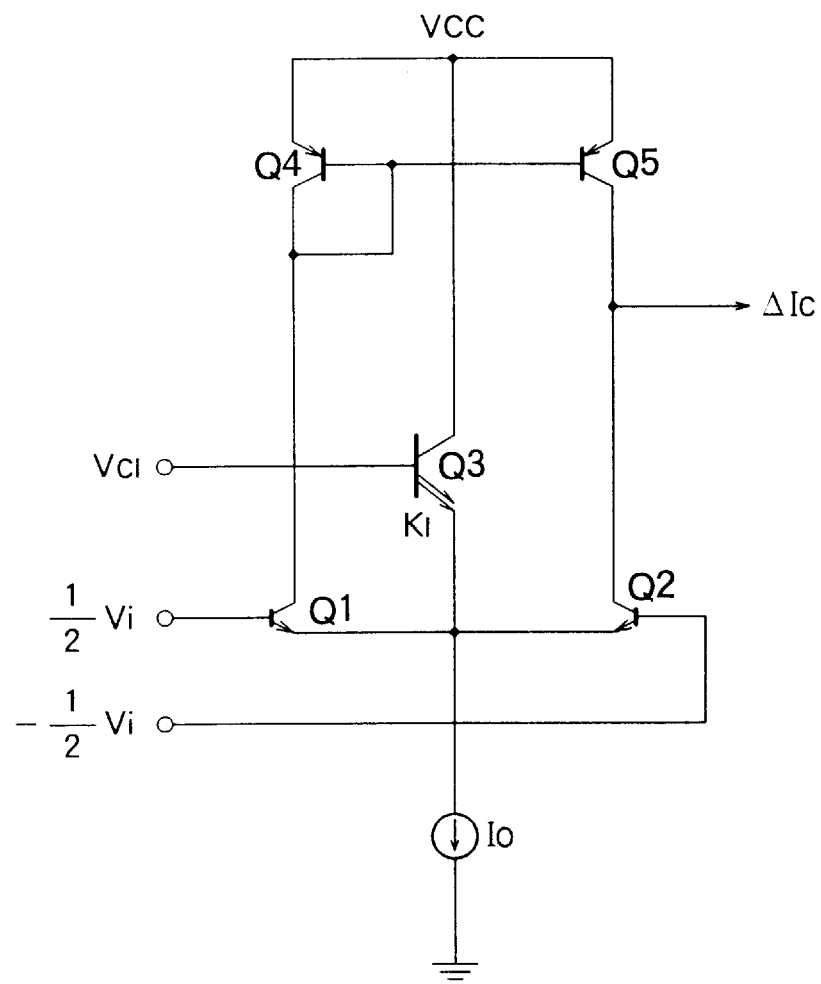
FIG. 11 is a circuit diagram of a triple-tail cell.

Referring to FIG. 11, description will now be made as regards a bipolar OTA comprising one triple-tail cell. Assuming matched devices, a differential output current $\Delta I_C$ of the triple-tail cell in FIG. 11 driven by the tail current $I_0$ is given by:

$$\Delta I_{C(Vi\cdot VC1)} = I_{C1} - I_{C2} = \frac{2\alpha_F I_0 \sinh\left(\frac{V_i}{2V_T}\right)}{2\cosh\left(\frac{V_i}{2V_T}\right) + K_1 \exp\left(\frac{V_{C1}}{V_T}\right)} \quad (29)$$

$$= \frac{\alpha_F I_0 \sinh\left(\frac{V_i}{2V_T}\right)}{\cosh\left(\frac{V_i}{2V_T}\right) + \frac{K_1}{2} \exp\left(\frac{V_{C1}}{V_T}\right)}$$

Herein, $V_{C1}$ represents a control voltage.

Substituting $(K_1/2)\exp(V_{C1}/V_T) = \cosh\{V_{Kj}/(2\ V_T)\}$ in Equation (29), the function form becomes identical with Equation (6) except that the input voltage is twice as high and the output current is half as small. In other words, the triple-tail cell corresponds to two symmetrical differential pairs forming the multi-tanh cell but has the input voltage twice as high and the output current half as low. As a matter of course, the linear input voltage range is no less than twice as wide.

The transconductance is obtained by taking a derivative of Equation (29) as follows:

$$\frac{d\Delta I_{C(Vi\cdot VC1)}}{dV_i} = \frac{\alpha_F I_0}{V_T}\left[\frac{K_1\exp\left(\frac{V_{C1}}{V_T}\right)\cosh\left(\frac{V_i}{2V_T}\right)+2}{\left\{2\cosh\left(\frac{V_i}{2V_T}\right)+K_1\exp\left(\frac{V_{C1}}{V_T}\right)\right\}^2}\right] \quad (30)$$

Figure 12:
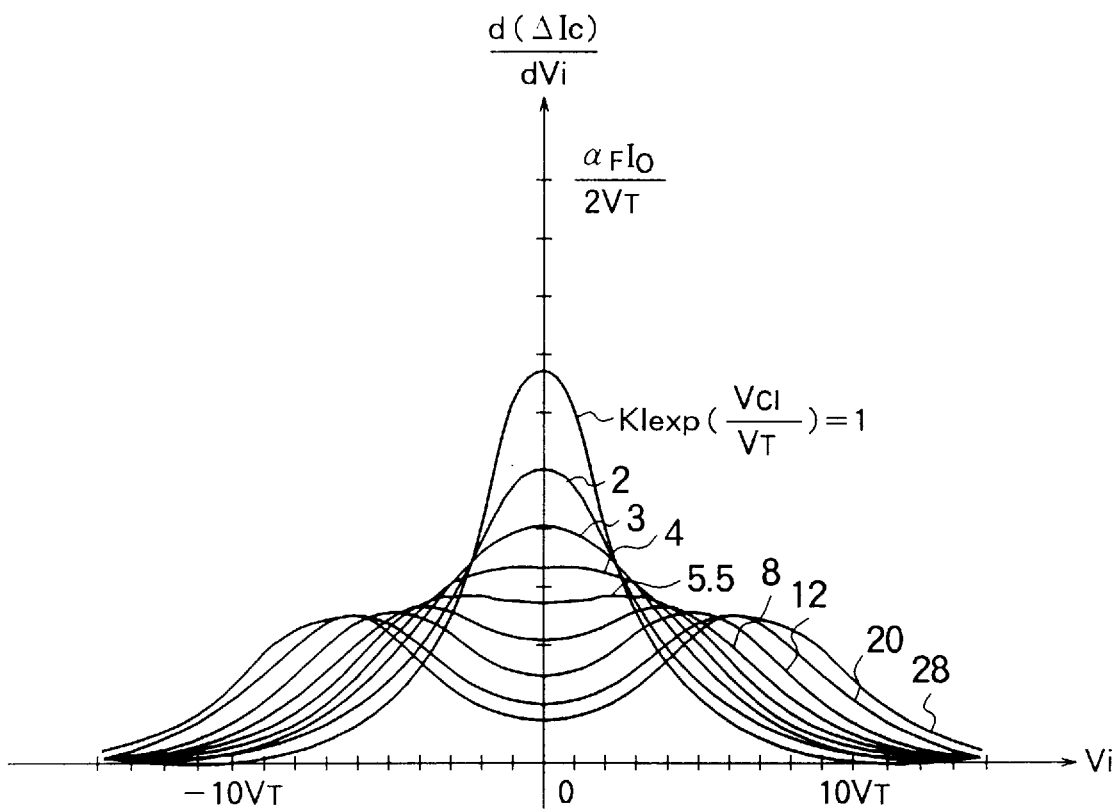
FIG. 12 is a view illustrating a transconductance characteristic of the triple-tail cell illustrated in FIG. 11.

FIG. 12 shows the transconductance characteristic of the triple-tail cell with $K_1\exp(V_{C1}/V_T)$ used as a parameter.

The transconductance of the triple-tail cell is maximally flat under the condition calculated by taking a third-order derivative of Equation (29) by the use of the input voltage $V_i$ as follows:

$$d^3(\Delta I_{C(Vi\cdot VC1)})/dV_i^3|_{Vi=0}=0$$

From the above equation:

$$K_1\exp\left(\frac{V_{C1}}{V_T}\right) = 4 \quad (31)$$

The differential output current $\Delta I_C$ in this case is given by:

$$\Delta I_{C(Vi)} = \frac{\alpha_F I_0 \sinh\left(\frac{V_i}{2V_T}\right)}{\cosh\left(\frac{V_i}{2V_T}\right)+2} \quad (32)$$

The transconductance in this case is as follows:

$$\frac{d(\Delta I_{C(Vi)})}{dV_i} = \frac{\alpha_F I_0}{2V_T}\left[\frac{2\cosh\left(\frac{V_i}{2V_T}\right)+1}{\left\{\cosh\left(\frac{V_i}{2V_T}\right)+2\right\}^2}\right] \quad (33)$$

The condition satisfying Equation (31) is calculated as $K_1=4$ when $V_{C1}=0$.

The differential output current of the multi-tanh doublet having the emitter area ratio K given by $K=2+3^{1/2}$ is given by Equation (11) and represented as $2\Delta I_{C(2Vi)}$ by the use of Equation (32). Specifically, the triple-tail cell and the multi-tanh doublet have analogous transfer characteristics. The former can deal with the input voltage twice as high. It is noted here that differential output is required in the triple-tail cell illustrated in FIG. 11.

Figure 13:
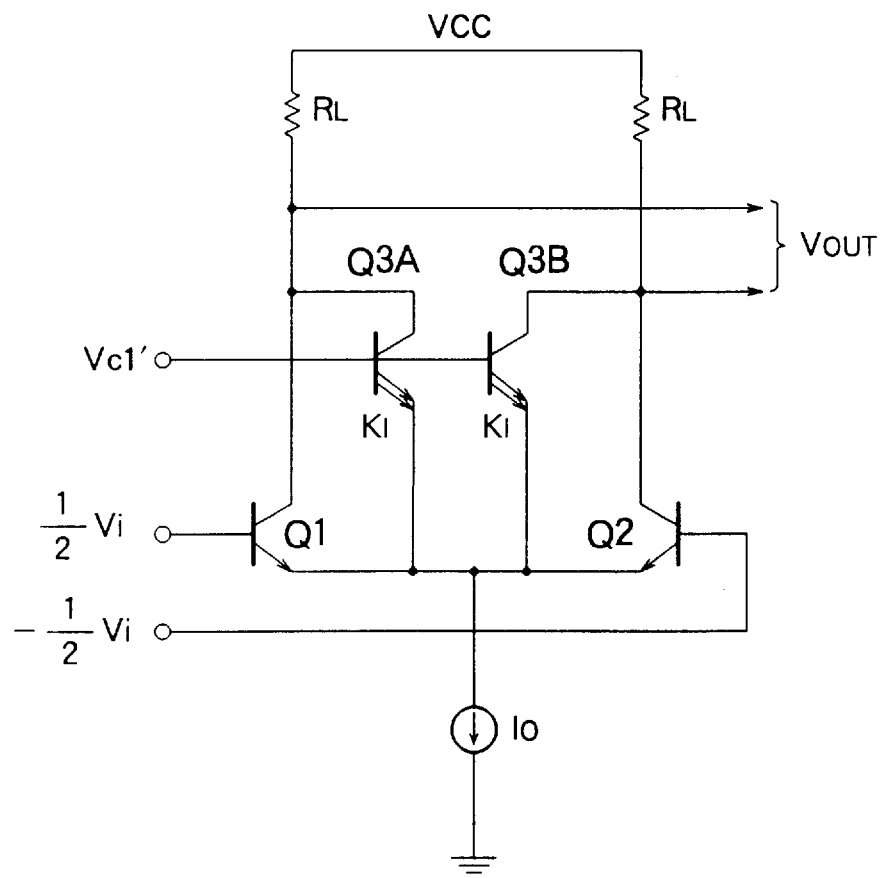
FIG. 13 is a circuit diagram of a bipolar OTA according to a seventh embodiment of this invention.

Turning to FIG. 13, description will proceed to a bipolar OTA according to a seventh embodiment of this invention. The bipolar OTA according to the seventh embodiment of this invention is an example of the above-mentioned bipolar OTA according to the third aspect of this invention.

Like in the bipolar OTA of FIG. 5, a circuit arrangement suitable for an LSI is obtained by the use of resistance loads $R_L$ in FIG. 13. In the bipolar OTA of FIG. 13, the bypass current flowing through the transistor Q3 (FIG. 11) is distributed into two distributed currents which are equal to each other. Two distributed currents are added to the output current of the triple-tail cell. This is acheived by transistors Q3A and Q3B. The control voltage $V_{C1}'$ is obtainted as:

$$V_{C1}'=V_{C1}-V_T\log_e 2 \quad (33\text{-b})$$

Therefore, the control voltage $V_{C1}'$ is lowered by approximately 18 mV than the orignal control voltage $V_{C1}$ at room temperature. In this case, the transistors Q1 and Q2 have a first common emitter area and the transistors Q3A and Q3B have a second common emitter area which is equal to $K_1$ times the first common emitter area. In another case where the second common emitter area is equal to $K_1/2$ times the first common emitter area, the control voltage $V_{C1}'$ is kept in the orignal control voltage $V_{C1}$.

In FIG. 13, a combination of the transistors Q1 and Q2 and the transistors Q3A and Q3B constitutes the quadri-tail cell.

Figure 14:
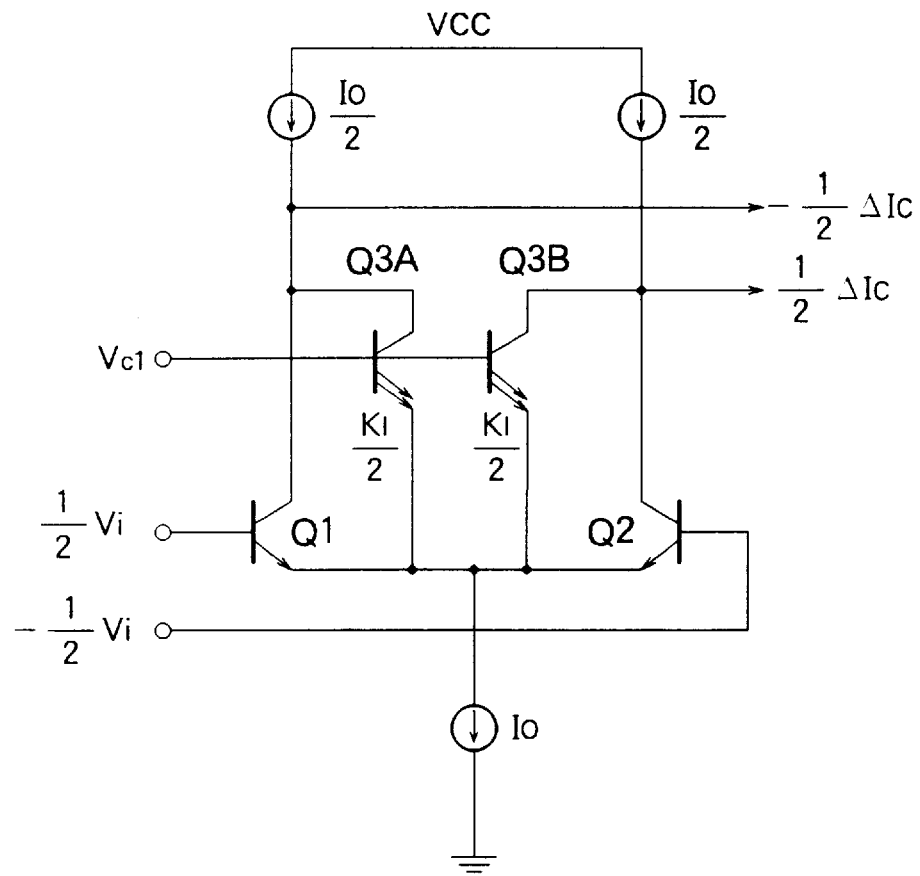
FIG. 14 is a circuit diagram of a bipolar OTA according to an eighth embodiment of this invention.

Turning to FIG. 14, description will proceed to a bipolar OTA according to an eighth embodiment of this invention. The bipolar OTA according to the eighth embodiment of this invention is another example of the above-mentioned bipolar OTA according to the third aspect of this invention.

The bipolar OTA of FIG. 14 is similar to that of FIG. 13 except that current loads $I_0/2$ are used instead of the resistance loads $R_L$ as differential output terminals. In this case, the obtained linear current can be produced through the current loads (load current supplies) $I_0/2$.

In order to dispense with the differential input, $V_i/2$ is added to all base voltages. By introducing the control voltage $V_C$, the emitter area ratio of the transistor Q3 is adjusted to a desired value, practically, to 1 so that the triple-tail cell can be formed by three unit transistors. The triple-tail cell thus obtained achieves the linear input voltage range on the order of 200 $mV_{P-P}$.

As described above, the triple-tail cell and the cross-coupled unbalanced differential pairs (multi-tanh doublet) have analogous transfer characteristics. Accordingly, it is possible to linearize the transconductance by the use of a plurality of triple-tail cells. In other words, the multiple triple-tail cell circuit can be a linear transconductance amplifier. In particular, the triple-tail cell can deal with the input voltage twice as high as that of the multi-tanh doublet as described in the foregoing. In this connection, two differential pairs realized by the multi-tanh technique can be replaced by a single triple-tall cell.

Figure 15:
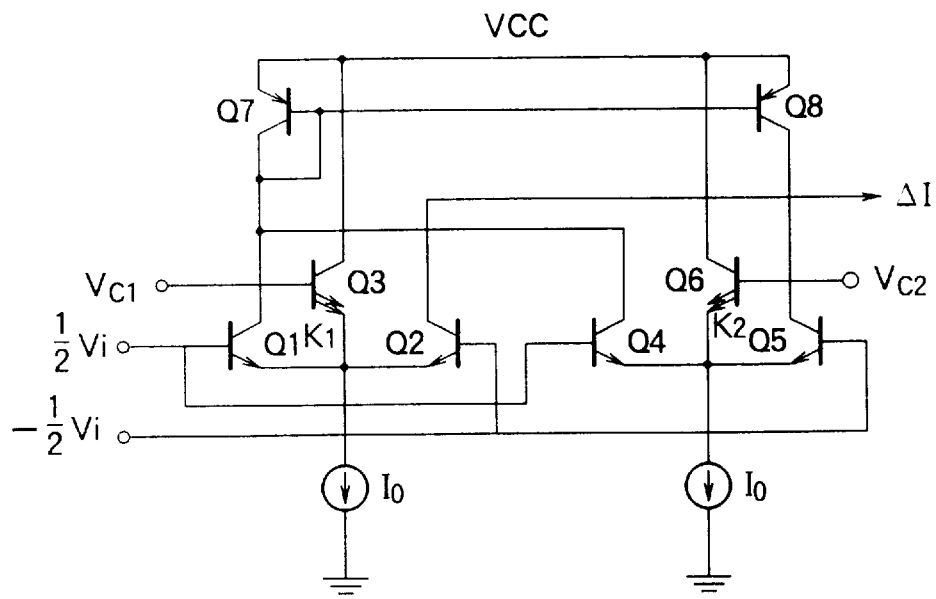
FIG. 15 is a circuit diagram of a bipolar OTA according to a ninth embodiment of this invention.

Turning to FIG. 15, description will proceed to a bipolar OTA according to a ninth embodiment of this invention. The bipolar OTA according to the ninth embodiment of this invention is an example of the above-mentioned bipolar OTA according to the fourth aspect of this invention.

The bipolar OTA of FIG. 15 is implemented by two triple-tail cells connected in parallel. It is noted here that differential output is required in the bipolar OTA implemented by two triple-tail cells illustrated in FIG. 15.

Figure 16:
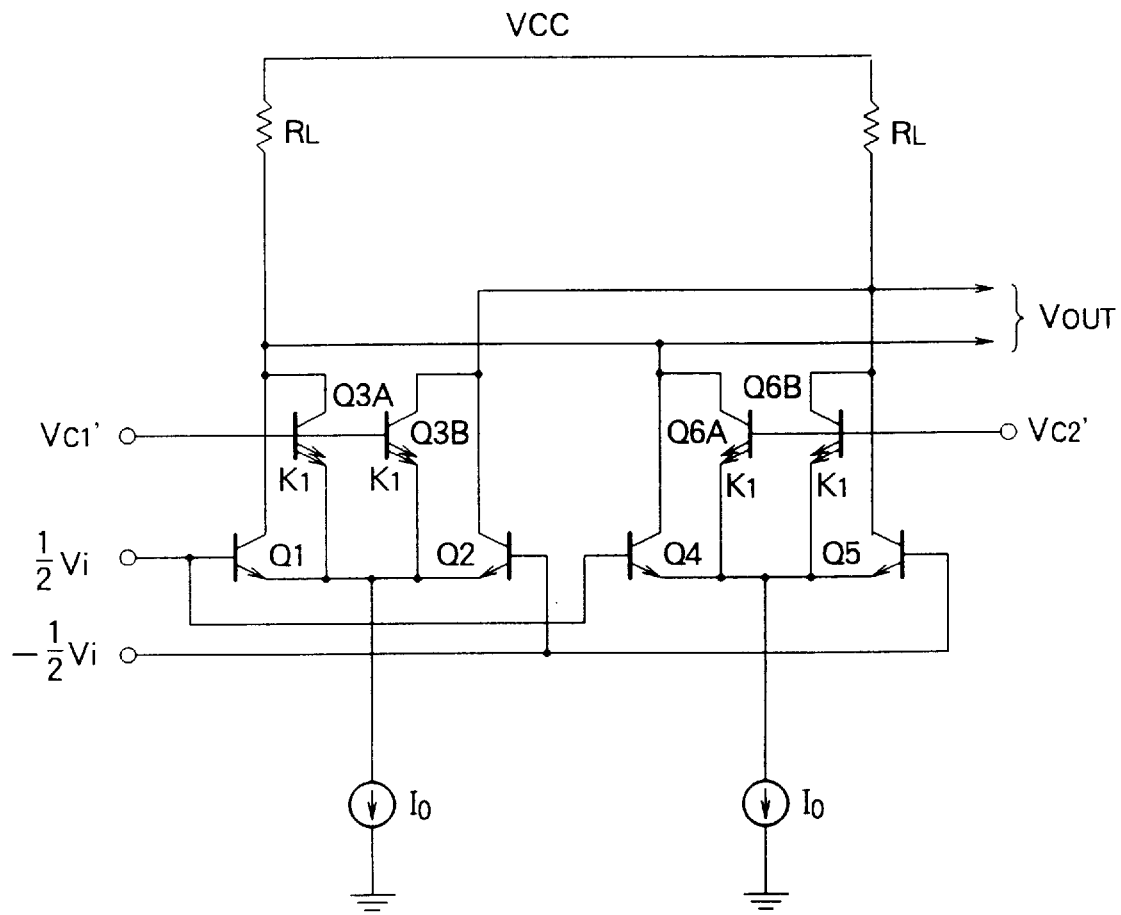
FIG. 16 is a circuit diagram of a bipolar OTA according to a tenth embodiment of this invention.

Turning to FIG. 16, description will proceed to a bipolar OTA according to a tenth embodiment of this invention. The bipolar OTA according to the tenth embodiment of this invention is an example of the above-mentioned bipolar OTA according to the fifth aspect of this invention.

Like in the bipolar OTA of FIG. 13, a circuit arrangement suitable for an LSI is obtained by the use of resistance loads $R_L$ in FIG. 16. In the bipolar OTA of FIG. 16, the bypass current flowing through each of the transistors Q3 and Q6 (FIG. 11) is distributed into two distributed currents which are equal to each other. Two distributed currents are added to the output currents of the triple-tail cells. This is acheived by transistors Q3A and Q3B and transistors Q6A and Q6B. The control voltages $V_{C1}'$ and $V_{C2}'$ are obtainted as:

$$V_{C1}'=V_{C1}-V_T\log_e 2 \quad (33\text{-}b)$$

$$V_{C2}'=V_{C2}-V_T\log_e 2 \quad (33\text{-}c)$$

Therefore, the control voltages $V_{C1}'$ and $V_{C2}'$ are lowered by approximately 18 mV than the orignal control voltages $V_{C1}$ and $V_{C2}$ at room temperature. In this case, the transistors Q1, Q2, Q4, and Q5 have a first common emitter area and the transistors Q3A, Q3B, Q6A, and Q6B have a second common emitter area which is equal to $K_1$ times the first common emitter area. In another case where the second common emitter area is equal to $K_1/2$ times the first common emitter area, the control voltages $V_{C1}'$ and $V_{C2}'$ are kept in the orignal control voltages $V_{C1}$ and $V_{C2}$.

Figure 17:
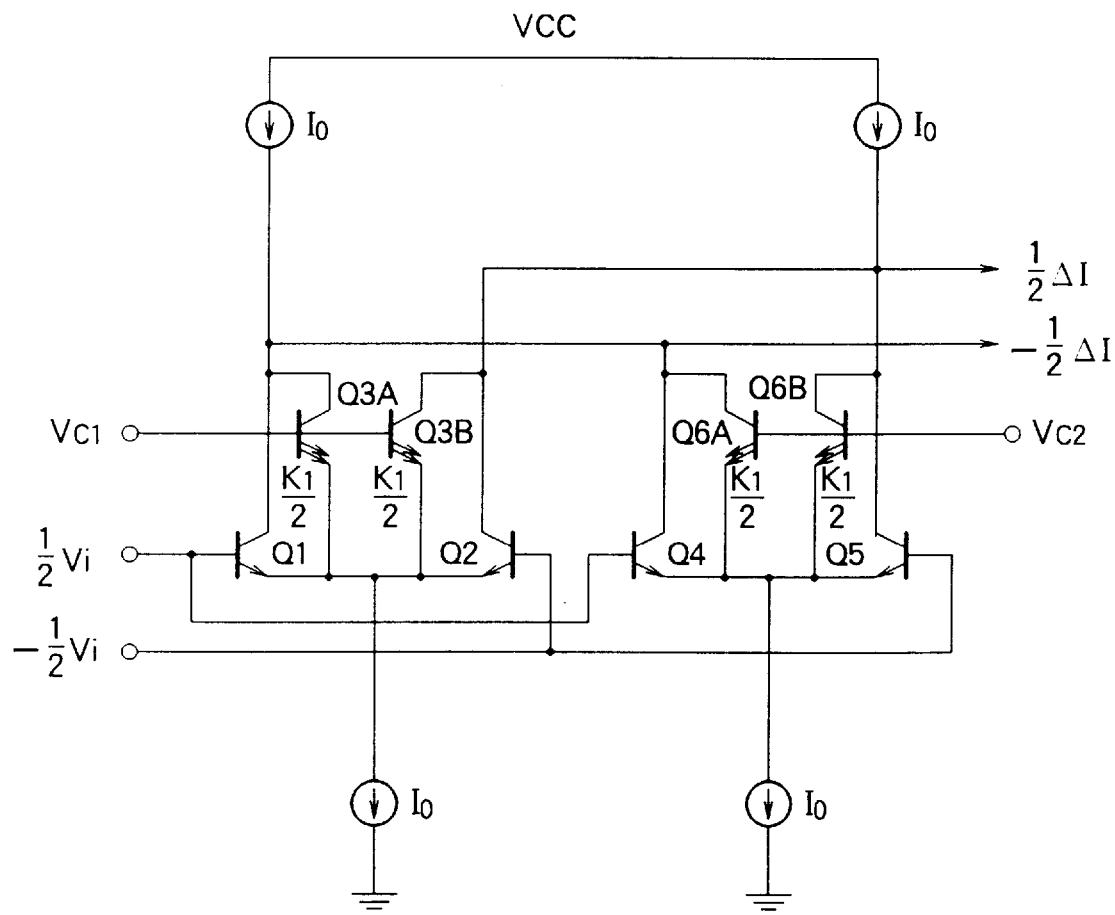
FIG. 17 is a circuit diagram of a bipolar OTA according to an eleventh embodiment of this invention.

Turning to FIG. 17, description will proceed to a bipolar OTA according to an eleventh embodiment of this invention. The bipolar OTA according to the eleventh embodiment of this invention is another example of the above-mentioned bipolar OTA according to the fifth aspect of this invention.

The bipolar OTA of FIG. 17 is similar to that of FIG. 16 except that current loads $I_0$ are used instead of the resistance loads $R_L$ as differential output terminals. In this case, the obtained linear current can be produced through the current loads (load current supplies) $I_0$.

This technique is superior to the super-multi-tanh technique in the first aspect of this invention because the linear input voltage range is twice as wide. In order to distinguish from the super-multi-tanh technique, it is understandable to call this technique as an ultra-multi-tanh technique rather than as a multiple triple-tall cell technique.

The differential output current $\Delta I$ of the multiple triple-tail cell circuit thus obtained is given by:

$$\Delta I = \sum_{j=1}^{N} \Delta I_{Cj(Vi-Vcj)} \quad (34)$$

$$= \sum_{j=1}^{N} \left\{ \frac{2\alpha_F I_{0j} \sinh\left(\dfrac{V_i}{2V_T}\right)}{2\cosh\left(\dfrac{V_i}{2V_T}\right) + K_j \exp\left(\dfrac{V_{Cj}}{V_T}\right)} \right\}$$

$$= \frac{\alpha_F \left[ \sum_{j=1}^{N} \left\{ C_j \sinh\left(\dfrac{jV_i}{2V_T}\right) \right\} \right]}{\sum_{j=1}^{N} \left\{ B_j \cosh\left(\dfrac{jV_i}{2V_T}\right) \right\}} \quad (35)$$

Thus, the function form is equivalent to that of Equation (8a). Specifically, the differential output current $\Delta I$ of the ultra-multi-tanh cell is similarly represented by the function of cosh as the denominator and the function of sinh as the numerator.

The relationship between the control voltage $V_{Cj}$ of the j-th triple-tail cell and the offset voltage $V_{Kj}$ of the two symmetrical differential pairs forming the multi-tanh cell is given from $K_j \exp(V_{Cj}/V_T)=2 \cosh\{V_{Kj}/(2 V_T)\}$ as:

$$V_{Cj} = V_T \log_e \left\{ \frac{K_j}{2} \cosh\left(\frac{V_{Kj}}{2V_T}\right) \right\} \quad (36)$$

Alternatively:

$$V_{Kj} = 2V_T \cosh^{-1}\left\{ \frac{K_j}{2} \exp\left(\frac{V_{Cj}}{V_T}\right) \right\} \quad (37)$$

$$= 2V_T \log_e \left\{ \frac{K_j \exp\left(\dfrac{V_{Cj}}{V_T}\right) + \sqrt{K_j^2 \exp\left(\dfrac{2V_{Cj}}{V_T}\right) - 4}}{2} \right\} \quad (38)$$

For example, in the ultra-multi-tanh doublet comprising two triple-tail cells illustrated in FIG. 15, calculation is made as follows:
From $$d^3(\Delta I/dV_i^3)|_{vi=0} = 0: \quad (39)$$

$$\frac{I_{01}\left\{K_1\exp\left(\dfrac{V_{C1}}{V_T}\right)-4\right\}}{\left\{K_1\exp\left(\dfrac{V_{C1}}{V_T}\right)+2\right\}^2} + \frac{I_{02}\left\{K_2\exp\left(\dfrac{V_{C2}}{V_T}\right)-4\right\}}{\left\{K_2\exp\left(\dfrac{V_{C2}}{V_T}\right)+2\right\}^2} = 0$$

From $$d^5(\Delta I)/dV_i^5|_{vi=0} = 0: \quad (40)$$

$$\frac{I_{01}\left\{K_1^2\exp\left(\dfrac{2V_{C1}}{V_T}\right)-26K_1\exp\left(\dfrac{V_{C1}}{V_T}\right)+64\right\}}{\left\{K_1\exp\dfrac{V_{C1}}{V_T}+2\right\}^2} +$$

$$\frac{I_{02}\left\{K_2{}^2\exp\left(\frac{2V_{C2}}{V_T}\right)-26K_2\exp\left(\frac{V_{C2}}{V_T}\right)+64\right\}}{\left\{K_2\exp\left(\frac{V_{C2}}{V_T}\right)+2\right\}^2}=0$$

In the ultra-multi-tanh doublet, many values are obtained which satisfy:

$$d^3(\Delta\ I)dV_i{}^3|_{Vi=0}=0$$

However, even if the flat transconductance characteristics are obtained, they are not always maximully flat. In the ultra-multi-tanh doublet, values satisfying:

$$d^3(\Delta\ I)/dV_i{}^3|_{Vi=0}=0$$

and $$d^5(\Delta\ I)/dV_i{}^5|_{Vi=0}=0$$

are determined as $V_{C1}$=0.925 $V_T$, $V_{C2}$=2.60 $V_T$, and $I_{01}/I_{02}$= 1.825 when $K_1$=$K_2$=1 to achieve the maximully flat transconductance characteristic.

Figure 18:
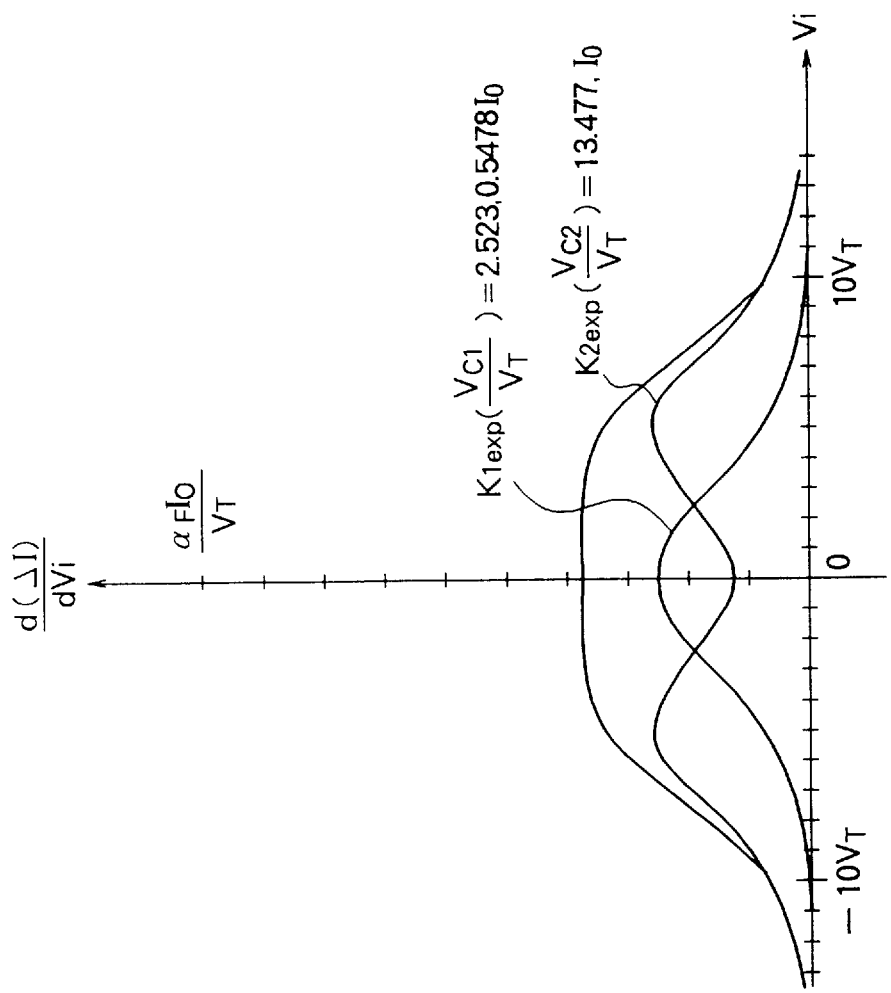
FIG. 18 is a view Illustrating a transconductance characteristic of the bipolar OTA illustrated in FIG. 15.
Figure 19:
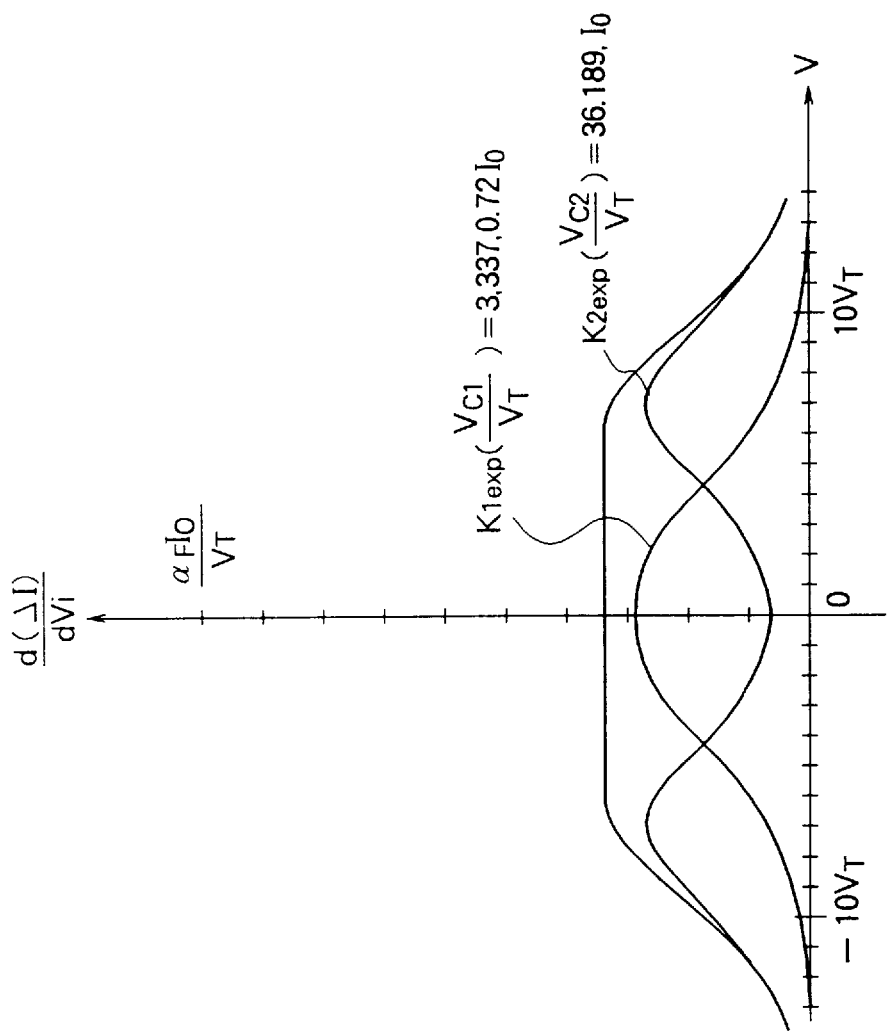
FIG. 19 is a view illustrating a transconductance characteristic of the bipolar OTA illustrated in FIG. 15.
Figure 20:
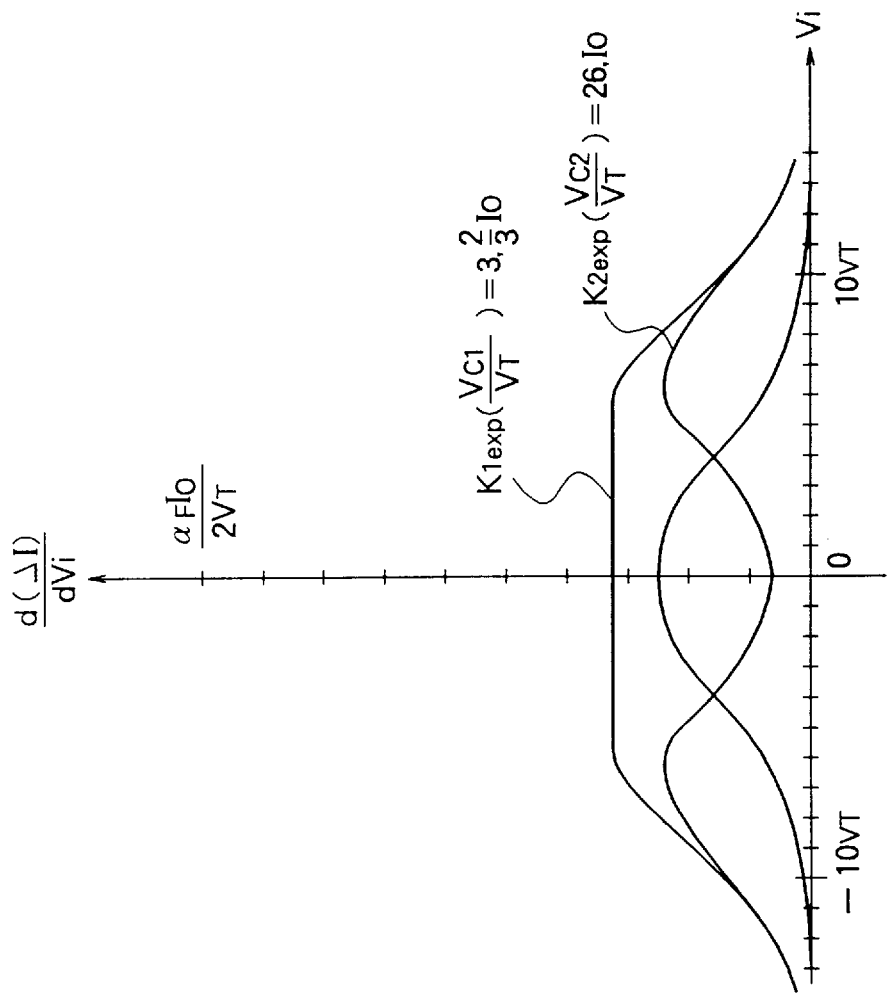
FIG. 20 is a view Illustrating a transconductance characteristic of a bipolar OTA illustrated in FIG. 15.

With reference to Tanimoto et al, the ultra-multi-tanh doublet thus obtained achieves the linear input voltage range on the order of 225 $mV_{P\text{-}P}$ from the transconductance characteristic illustrated in FIG. 18. Also with reference to Tanimoto et al, a substantially linear input voltage range on the order of 350 $mV_{P\text{-}P}$ can be realized from the transconductance characteristic illustrated in FIG. 19 as far as an equiripple characteristic of 0.8% is allowed. Furthermore, the tail current ratio may be selected to 3:2 so as to facilitate realization of the linear input voltage range. In this event, a substantially linear input voltage range on the order of 330 $mV_{P\text{-}P}$ is realized from the transconductance characteristic illustrated in FIG. 20 although the equiripple characteristic of 0.3% is given.

It will be understood that, in the ultra-multi-tanh technique, the linear input voltage range can be further widened by the use of three or more triple-tail cells.

Figure 21:
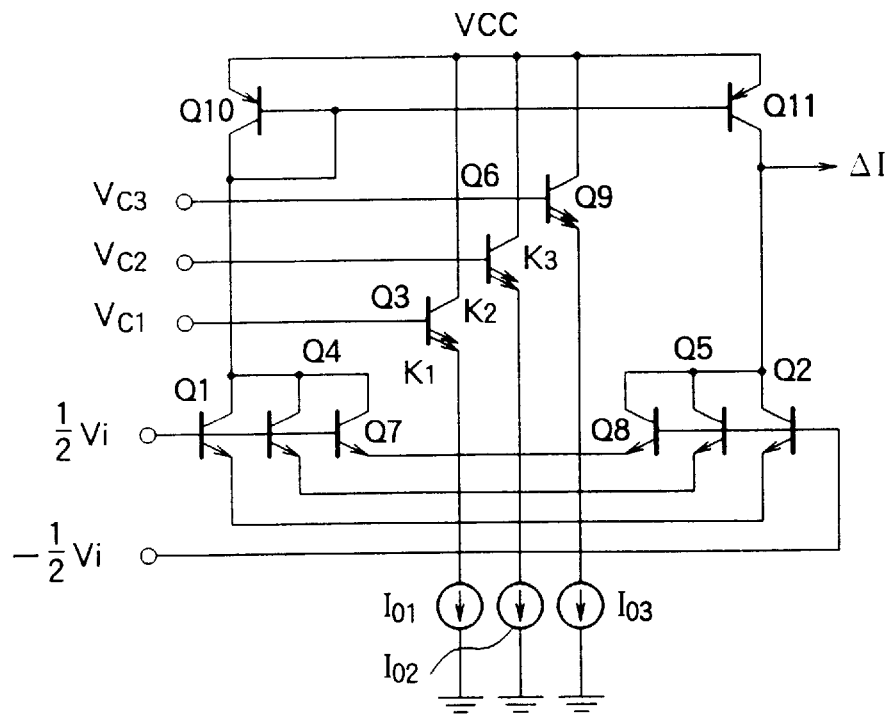
FIG. 21 is a circuit diagram of a bipolar OTA according to a twelfth embodiment of this invention.
Figure 22:
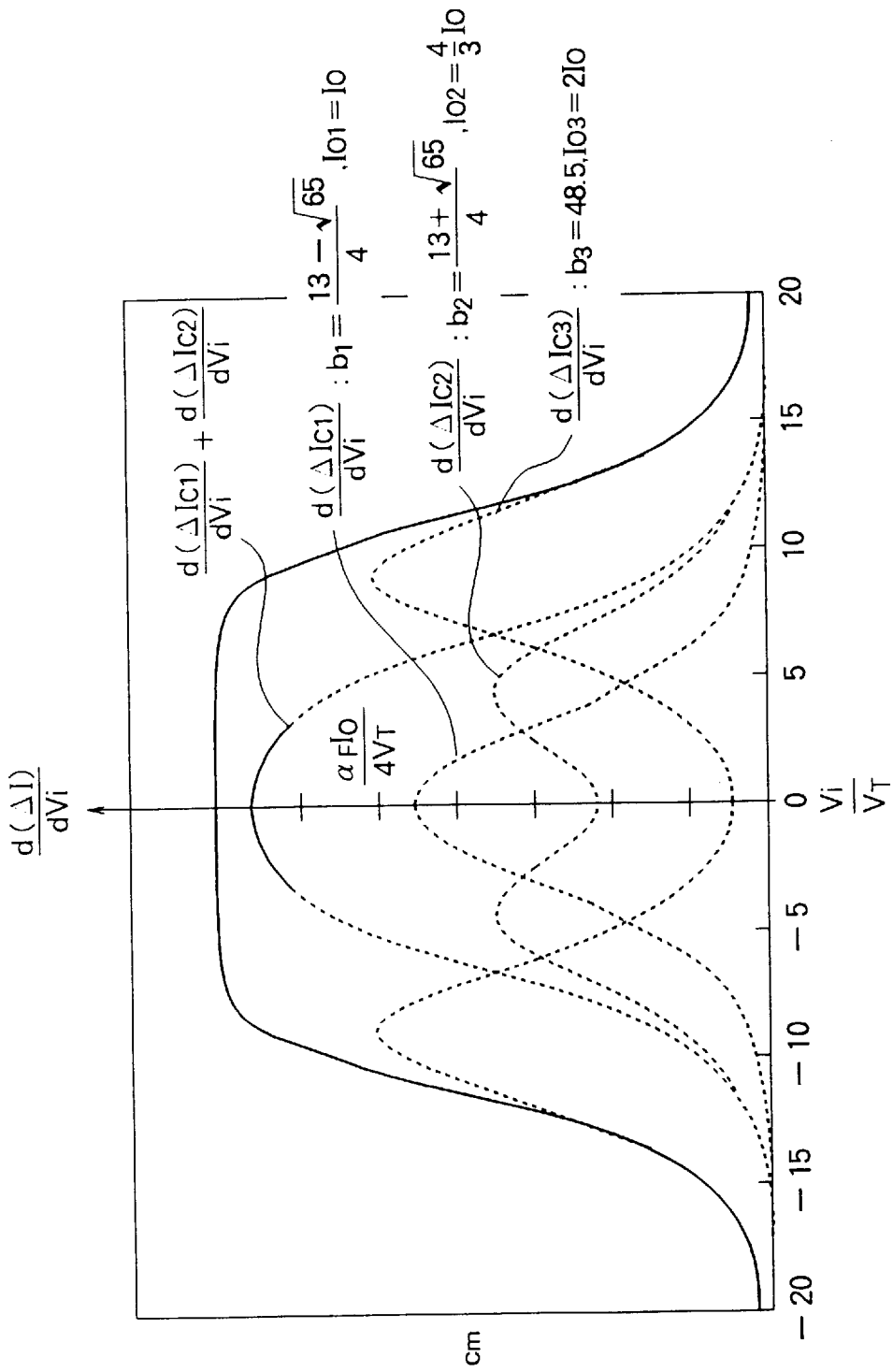
FIG. 22 is a view illustrating a transconductance characteristic of the bipolar OTA illustrated in FIG. 21.
Figure 23:
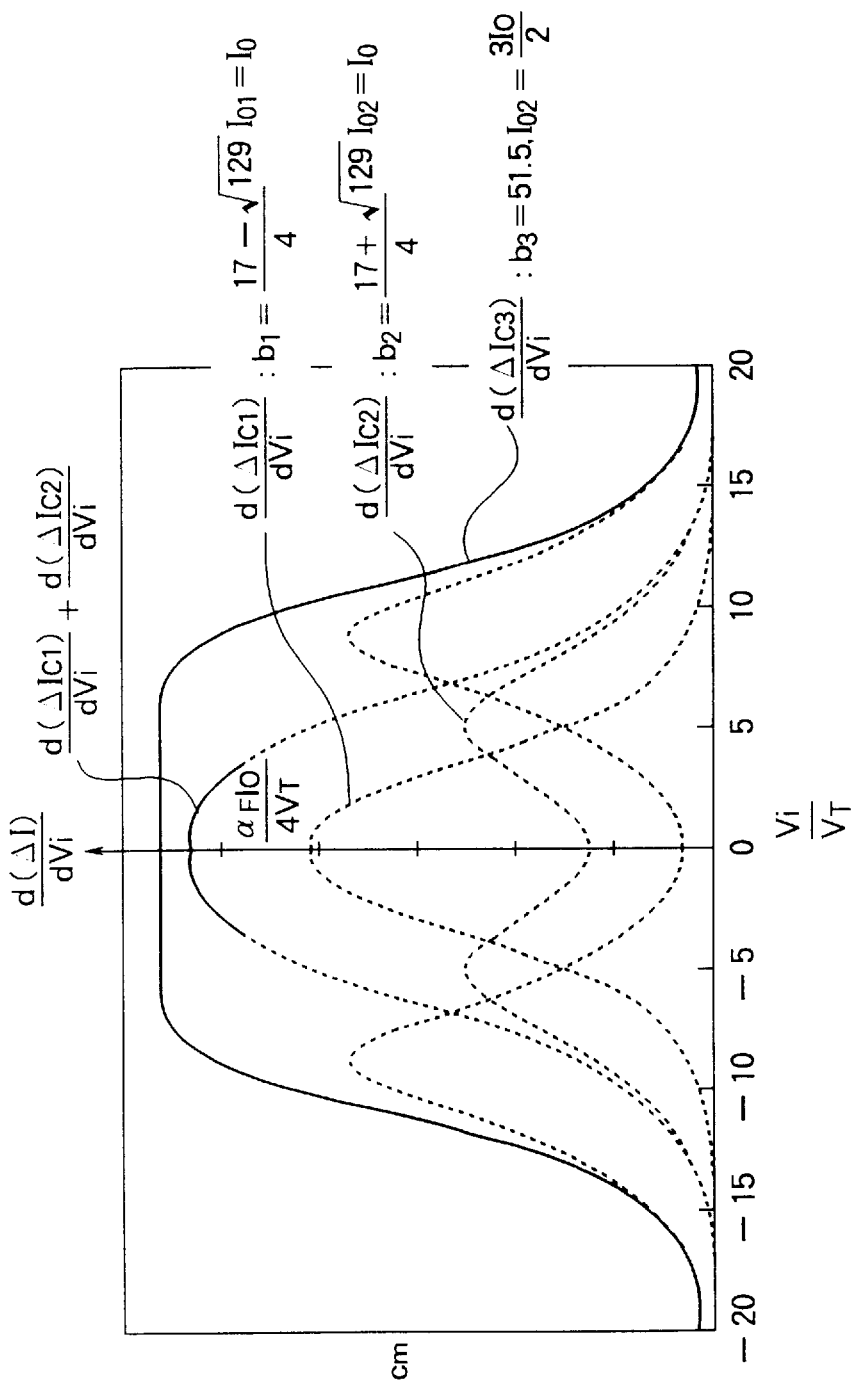
FIG. 23 is a view illustrating a transconductance characteristic of the bipolar OTA illustrated in FIG. 21.

As a realized example of the ultra-multi-tanh cell, calculated values of the transconductance characterisitc of a ultra-multi-tanh triplet illustrated in FIG. 21 are shown in FIGS. 22 and 23. The ultra-multi-tanh triplet of FIG. 21 is a bipolar OTA according to a twelfth embodiment of this invention. The bipolar OTA according to the twelfth embodiment of this invention is a further example of the above-mentioned bipolar OTA according to the fourth aspect of this invention.

In FIG. 22, the tail current ratio of three triple-tail cells is 1:(4/3):2. In this case, values of $(K_j/2)\exp(V_{cj}/V_T)$ are $(13-65^{1/2})/4$, $(13+65^{1/2})/4$, and 48.5. The input voltage range within the equiripple characteristic of 0.2% is 320 $mV_{P\text{-}P}$.

In FIG. 23, the tail current ratio of three triple-tail cells is 1:1:(3/2). In this case, values of $(K_j/2)\exp(V_{cj}/V_T)$ are $(17-129^{1/2})/4$, $(17+129^{1/2})/4$, and 48.5. The input voltage range within the equiripple characteristic of 0.6% is 310 $mV_{P\text{-}P}$.

As readily understood from FIGS. 22 and 23, a lenear characteristic is obtained by adding the transconductance characterisitc of a single peak and the transconductance characterisitc of a double peak.

Figure 24:
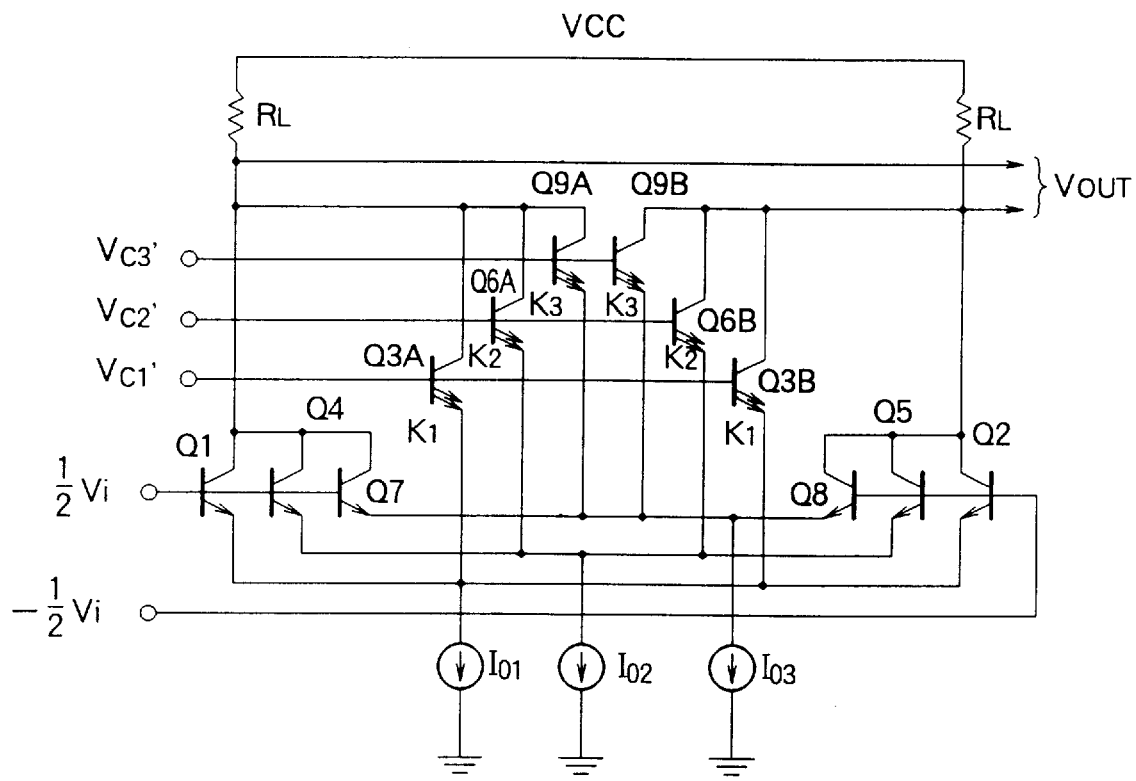
FIG. 24 is a circuit diagram of a bipolar OTA according to a thirteenth embodiment of this invention.

Turning to FIG. 24, another ultra-multi-tanh cell is illustrated which is a bipolar OTA according to an thirteenth embodiment of this invention. The bipolar OTA according to the thirteenth embodiment of this invention is still another example of the above-mentioned bipolar OTA according to the fifth aspect of this invention.

In the ultra-multi-tanh cell illustrated in FIG. 24, a circuit arrangement suitable for an LSI is obtained by the use of resistance loads $R_L$ like in the super-multi-tanh cell and in the ultra-multi-tanh cell. In the bipolar OTA of FIG. 24, the bypass current flowing through each of the transistors Q3, Q6, and Q9 is distributed into two distributed currents which are equal to each other. Two distributed currents are added to the output current of each triple-tail cell. This is acheived by transistors Q3A and Q3B. transistors Q6A and Q6B, and transistors Q9A and Q9B. Control voltages $V_{C1}'$, $V_{C2}'$, and $V_{C3}'$ are obtainted as:

$$V_{C1}'=V_{C1}-V_T\log_e 2 \quad (33\text{-b})$$

$$V_{C2}'=V_{C2}-V_T\log_e 2 \quad (33\text{-c})$$

$$V_{C3}'=V_{C3}-V_T\log_e 2 \quad (33\text{-d})$$

Therefore, the control voltages $V_{C1}'$, $V_{C2}'$, and $V_{C3}'$ are lowered by approximately 18 mV than the orignal control voltages $V_{C1}$, $V_{C2}$, and $V_{C3}$ (FIG. 21) at room temperature. In this case, the transistors Q1, Q2, Q4, Q5, Q7, and Q8 have a first common emitter area. The transistors Q3A and Q3B have a second common emitter area which is equal to $K_1$ times the first common emitter area. The transistors Q6A and Q6B have a third common emitter area which is equal to $K_2$ times the first common emitter area. The transistors Q9A and Q9B have a third common emitter area which is equal to $K_3$ times the first common emitter area. In another case where the second common emitter area is equal to $K_1/2$ times the first common emitter area, where the third common emitter area is equal to $K_2/2$ times the first common emitter area, and where the third common emitter area is equal to $K_3/2$ times the first common emitter area, the control voltages $V_{C1}'$, $VC_2'$ and $V_{C3}'$ are kept in the original control voltages $V_{C1}$, $V_{C2}$, and $V_{C3}$.

Figure 25:
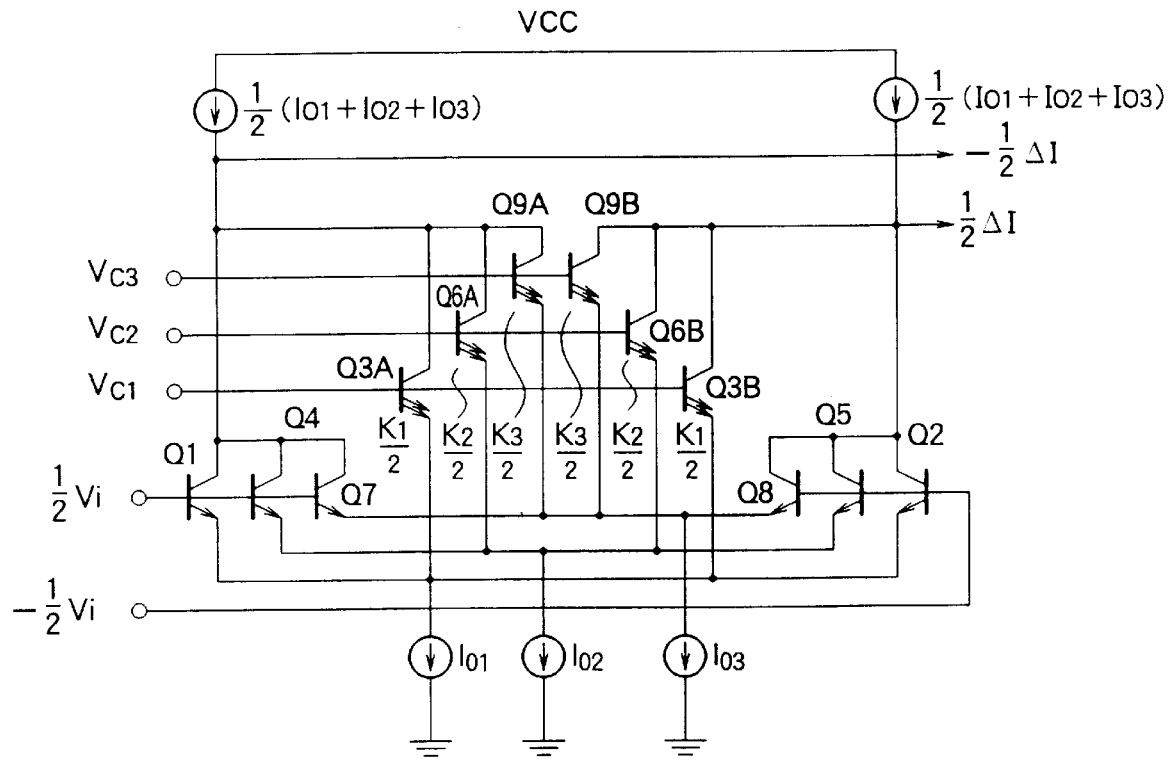
FIG. 25 is a circuit diagram of a bipolar OTA according to a fourteenth embodiment of this invention.

Turning to FIG. 25, description will proceed to a bipolar OTA according to a fourteenth embodiment of this invention. The bipolar OTA according to the fourteenth embodiment of this invention is a different example of the above-mentioned bipolar OTA according to the fifth aspect of this invention.

The bipolar OTA of FIG. 25 is similar to that of FIG. 24 except that current loads $(½)(I_{01}+I_{02}+I_{03})$ are used instead of the resistance loads $R_L$ as differential output terminals. In this case, the obtained linear current can be produced through the current loads (load current supplies) $(½)(I_{01}+I_{02}+I_{03})$.

Figure 26:
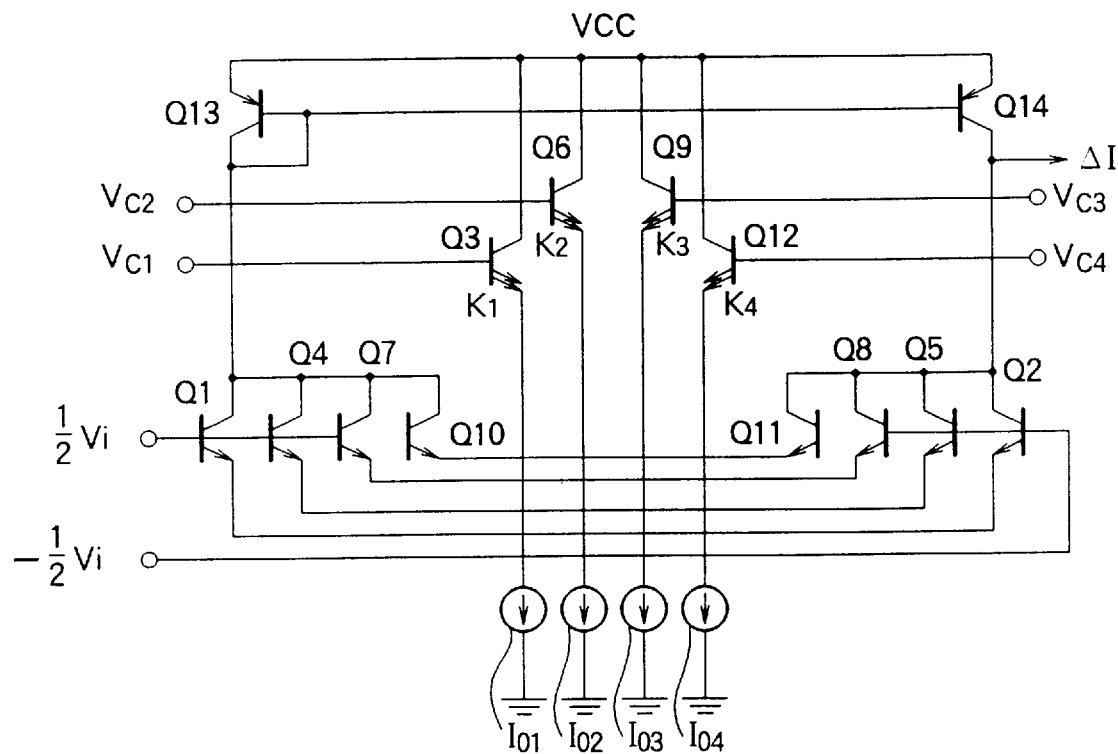
FIG. 26 is a circuit diagram of a bipolar OTA according to a fifteenth embodiment of this invention.
Figure 27:
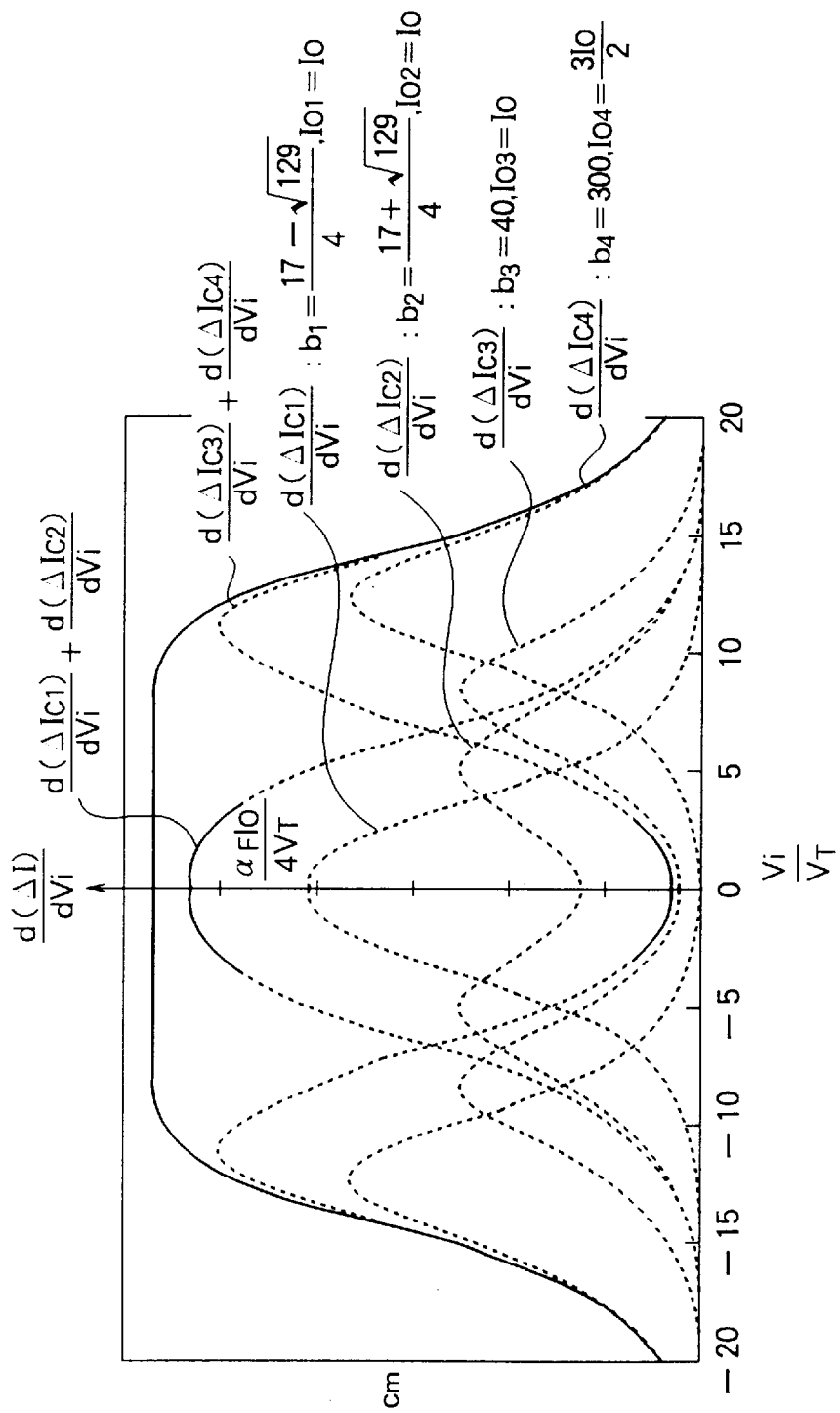
FIG. 27 is a view illustrating a transconductance characteristic of the bipolar OTA illustrated in FIG. 26.

As a realized example of the ultra-multi-tanh cell of a high order, calculated valued of the transconductance characteristic of a ultra-multi-tanh quad illustrated in FIG. 26 are shown in FIG. 27. The ultra-multi-tanh quad of FIG. 26 is a bipolar OTA according to a fifteenth embodiment of this invention. The bipolar OTA according to the fifteenth embodiment of this invention is a still further example of the above-mentioned bipolar OTA according to the fourth aspect of this invention.

In FIG. 27, the tail current ratio of four triple-tail cells is 1:1:1: (3/2). In this case, values of $(K_j/2)\exp(V_{cj}/V_T)$ are $(17-129^{1/2})/4$, $(17-129^{1/2})/4$, 40, and 300. The input voltage range within the equiripple characteristic of 0.3% is 500 $mV_{P\text{-}P}$.

As readily understood from FIG. 27, a linear characteristic is obtained by adding the transconductance characteristic of a single peak and the transconductance characteristic of a double peak.

Figure 28:
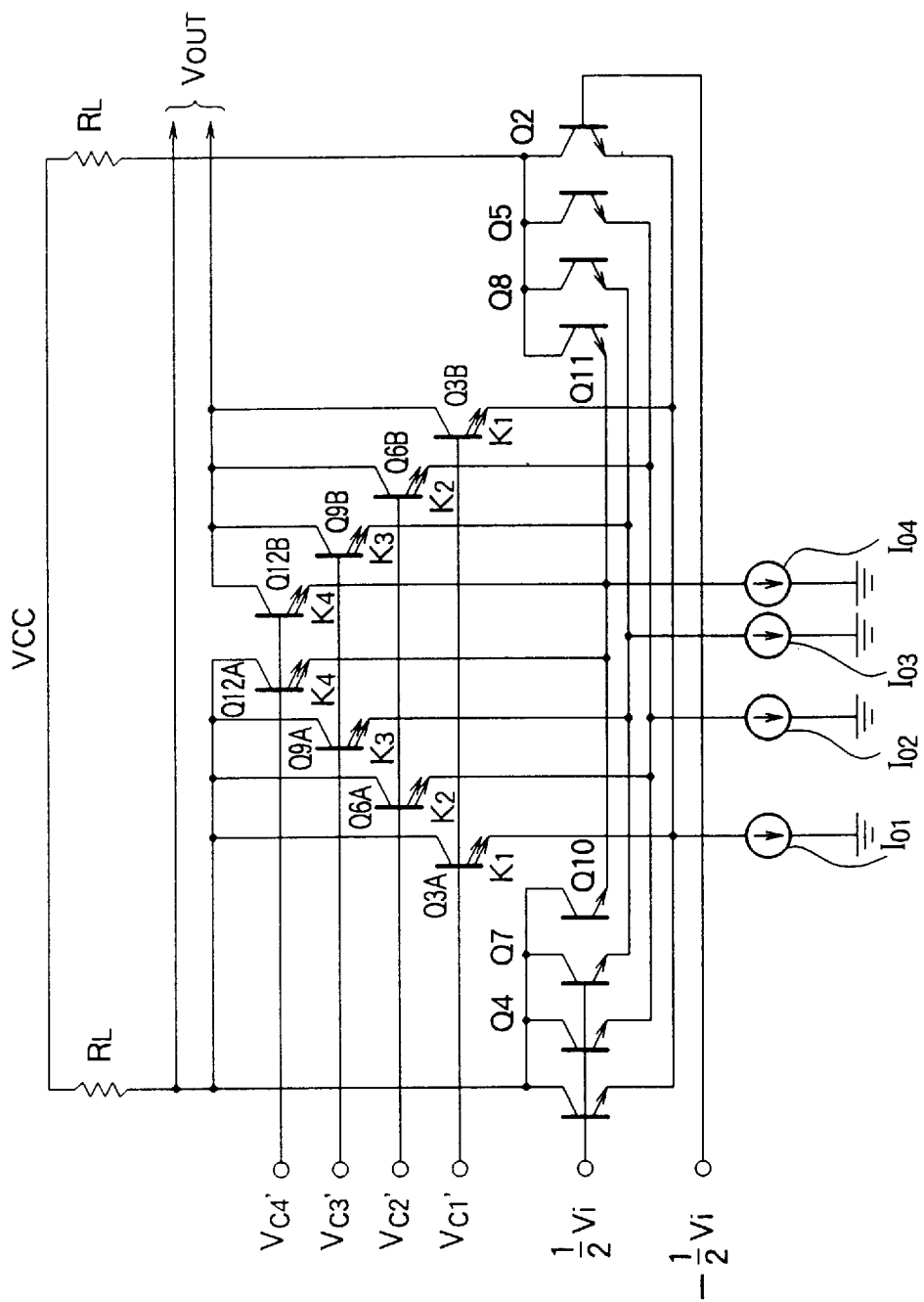
FIG. 28 is a circuit diagram of a bipolar OTA according to a sixteenth embodiment of this invention.

Turning to FIG. 28, still another ultra-multi-tanh cell is illustrated which is a bipolar OTA according to a sixteenth embodiment of this invention. The bipolar OTA according to the sixteenth embodiment of this invention is a different example of the above-mentioned bipolar OTA according to the fifth aspect of this invention.

In the ultra-multi-tanh cell illustrated in FIG. 28, a circuit arrangement suitable for an LSI is obtained by the use of resistance loads $R_L$ like in the super-multi-tanh cell and in the ultra-multi-tanh cell. In the bipolar OTA of FIG. 28, the bypass current flowing through each of the transistors Q3, Q6, Q9, and Q12 is distributed into two distributed currents which are equal to each other. Two distributed currents are added to the output current of each triple-tail cell. This is achieved by transistors Q3A and Q3B. transistors Q6A and Q6B, transistors Q9A and Q9B, and transistors Q12A and Q12B. Control voltages $V_{C1}'$, $V_{C2}'$, $V_{C3}'$, and $V_{C4}'$ are obtained as:

$$V_{C1}' = V_{C1} - V_T \log_e 2 \tag{33-b}$$

$$V_{C2}' = V_{C2} - V_T \log_e 2 \tag{33-c}$$

$$V_{C3}' = V_{C3} - V_T \log_e 2 \tag{33-d}$$

$$V_{C4}' = V_{C4} - V_T \log_e 2 \tag{33-e}$$

Therefore, the control voltages $V_{C1}'$, $V_{C2}'$, $V_{C3}'$, and $V_{C4}'$ are lowered by approximately 18 mV than the original control voltages $V_{C1}$, $V_{C2}$, $V_{C3}$, and $V_{C4}$ (FIG. 26) at room temperature. In this case, the transistors Q1, Q2, Q4, Q5, Q7, Q8, Q10, and Q11 have a first common emitter area. The transistors Q3A and Q3B have a second common emitter area which is equal to $K_1$ times the first common emitter area. The transistors Q6A and Q6B have a third common emitter area which is equal to $K_2$ times the first common emitter area. The transistors Q9A and Q9B have a third common emitter area which is equal to $K_3$ times the first common emitter area. The transistors Q12A and Q12B have a fourth common emitter area which is equal to $K_4$ times the first common emitter area. In another case where the second common emitter area is equal to $K_1/2$ times the first common emitter area, where the third common emitter area is equal to $K_2/2$ times the first common emitter area, where the third common emitter area is equal to $K_3/2$ times the first common emitter area, and where the fourth common emitter area is equal to $K_4/2$ times the first common emitter area, the control voltages $V_{C1}'$, $V_{C2}'$, $V_{C3}'$, and $V_{C4}'$ are kept in the orignal control voltages $V_{C1}$, $V_{C2}$, $V_{C3}$, and $V_{C4}$.

Figure 29:
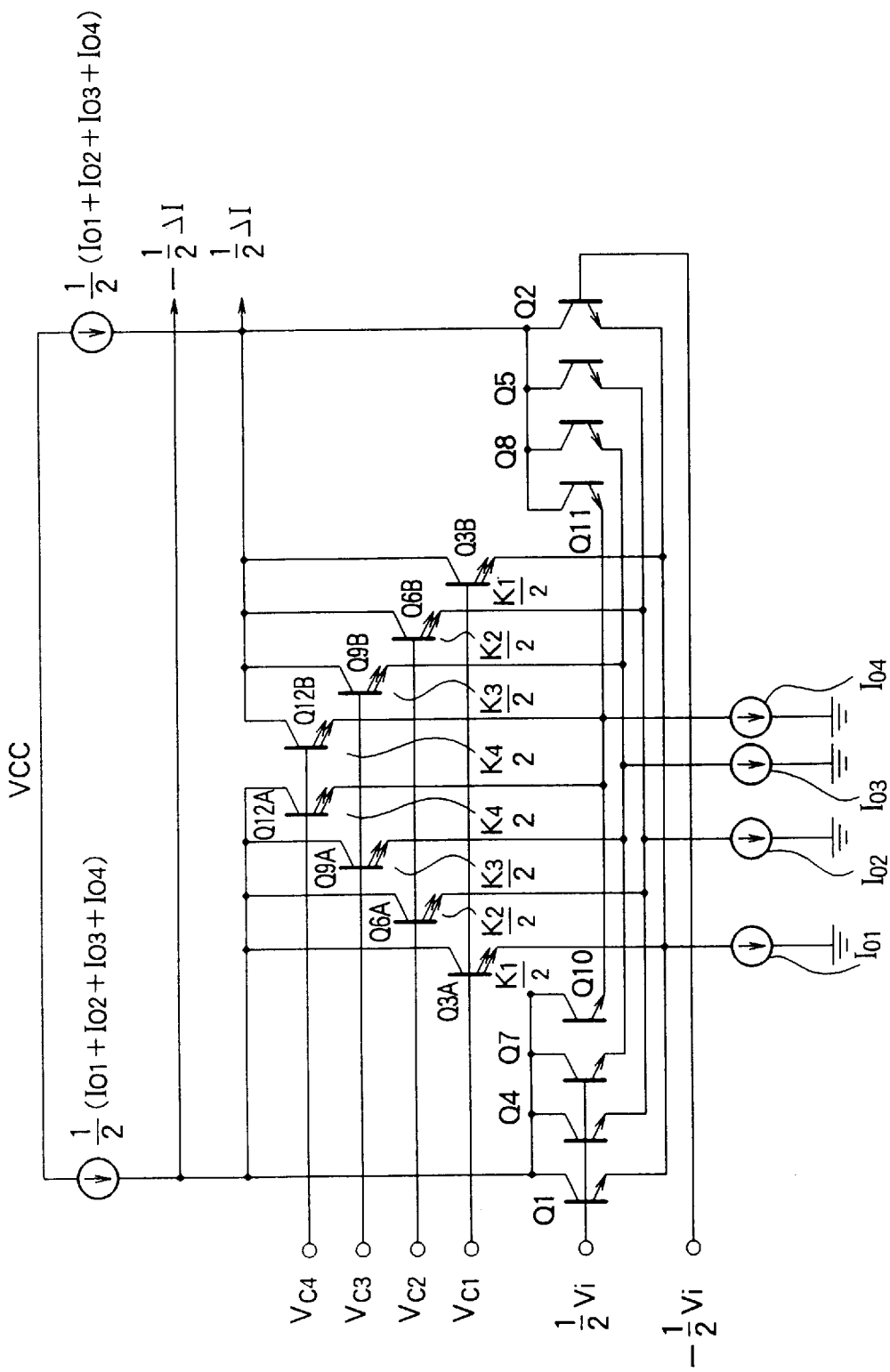
FIG. 29 is a circuit diagram of a bipolar OTA according to a seventeenth embodiment of this invention.

Turning to FIG. 29, description will proceed to a bipolar OTA according to a seventeenth embodiment of this invention. The bipolar OTA according to the seventeenth embodiment of this intention is a different example of the above-mentioned bipolar OTA according to the fifth aspect of this invention.

The bipolar OTA of FIG. 29 is similar to that of FIG. 28 except that current loads $(\frac{1}{2})(I_{O1}+I_{O2}+I_{O3}+I_{O4})$ are used instead of the resistance loads $R_L$ as differential output terminals. In this case, the obtained linear current can be produced through the current loads (load current supplies) $(\frac{1}{2})(I_{O1}+I_{O2}+I_{O3}+I_{O4})$.

In any case, the circuit structure can be implemented by the unit transistors of a minimum number without using the transistors having different emitter areas. Thus, unlike the conventional multi-tanh technique and the super-multi-tanh technique according to the first aspect of this invention, the circuit structure can be extremely simplified. Thus, it is quite appropriate to call this technique as the ultra-multi-tanh technique.

As seen from FIG. 15, the bipolar OTA thus obtained is operable at a low voltage, like the bipolar OTA using the conventional multi-tanh technique or the bipolar OTA according to the first aspect of this invention. The ultra-multi-tanh cell of the lower-order is operable even at a very low voltage such as the supply voltage $V_{CC}=1$ V.

As described above, the bipolar OTA according to this invention achieves a highly linear and wide input voltage range with a relatively simple circuit and is operable at a low voltage on the order of 1 V.

What is claimed is:

1. A bipolar OTA (operational transconductance amplifier) including a plurality of triple-tall cells each of which comprises a transistor pair of first and second transistors forming a differential input/output pair and a third transistor applied with a control voltage, said transistor pair and said third transistor being driven by a common tail current, said OTA comprising means for applying a dc offset voltage to an input signal of said differential input/output pair, said plurality of triple-tail cells having outputs connected in parallel.

2. A bipolar OTA as claimed in claim 1, wherein a current which flows through the third transistor of each of said plurality of triple-tail cells is distributed into two distributed currents which are equal to each other and which are added to a differential output current of each of said plurality of triple-tall cells.

3. A bipolar OTA (operational transconductance amplifier) including a quardri-tail cell which comprises a transistor pair of first and second transistors forming a differential input/output pair and third and fourth transistors applied with a control voltage in common, said transistor pair and said third and said fourth transistors being driven by a common tail current, said first and said third transistors having outputs which are connected to each other to form a first common output, said second and said fourth transistors having outputs which are connected to each other to form second common output which forms an output pair together with said first common output, wherein said first and said second transistors have emitters of a first common emitter area, said third and said fourth transistors have emitters of a second common emitter area which is equal to K (K being a positive number) times said first common emitter area, said control voltage $V_C$ being defined so as to become substantially equal to $V_T \log_e(K/2)$, where $V_T$ represents the thermal voltage (26 mV at room temperature).

4. A bipolar OTA (operational transconductance amplifier) including a plurality of triple-tail cells each of which comprises a transistor pair of first and second transistors forming a differential input/output pair and a third transistor applied with a control voltage, said transistor pair and said third transistor being driven by a common tail current, said plurality of triple-tail cells having outputs connected in parallel and inputs connected in parallel, the control voltages of the third transistors of said plurality of triple-tail cells being different from each other.

5. A bipolar OTA as claimed in claim 4, wherein a current which flows through the third transistor of each of said plurality of triple-tail cells is distributed into two distributed currents which are equal to each other and which are added to a differential output current of said plurality of triple-tail cells.

* * * * *